(12) United States Patent
Inoue et al.

(10) Patent No.: US 9,109,759 B2
(45) Date of Patent: Aug. 18, 2015

(54) LIGHT-EMITTING ELEMENT

(75) Inventors: Hiroyasu Inoue, Tokyo (JP); Kenichi Harai, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 13/994,184

(22) PCT Filed: Dec. 20, 2011

(86) PCT No.: PCT/JP2011/079449
§ 371 (c)(1),
(2), (4) Date: Jun. 14, 2013

(87) PCT Pub. No.: WO2012/086623
PCT Pub. Date: Jun. 28, 2012

(65) Prior Publication Data
US 2013/0257267 A1 Oct. 3, 2013

(30) Foreign Application Priority Data

Dec. 24, 2010 (JP) ................................. 2010-288567

(51) Int. Cl.
*H01J 5/16* (2006.01)
*H01J 61/40* (2006.01)
(Continued)

(52) U.S. Cl.
CPC .............. *F21K 9/50* (2013.01); *H01L 51/5262* (2013.01); *H01L 2251/5361* (2013.01)

(58) Field of Classification Search
CPC . H01L 51/5275; H01L 51/5262; H01L 33/58; H01L 27/14625; H01L 27/14627; H01L 31/02327; H01L 31/0524; H01L 31/0525; H01L 2251/5361; F21Y 2105/008; G02B 5/201; G02B 6/005; G02B 27/0961; G02B 6/0033; G02B 3/0062; G02B 6/003; G02B 6/0013; G02B 6/0063; G02B 6/4204; F21S 48/1163; F21S 48/1266; H01J 2211/44; F21K 9/50

See application file for complete search history.

(56) References Cited

U.S. PATENT DOCUMENTS

2004/0119912 A1* 6/2004 Takeuchi et al. ................ 349/95
2005/0169008 A1 8/2005 Okazaki
2005/0212989 A1 9/2005 Kashiwagi et al.
(Continued)

FOREIGN PATENT DOCUMENTS

JP 8-83688 A 3/1996
JP 2003-29674 A 1/2003
(Continued)

OTHER PUBLICATIONS

International Search Report Issued in PCT/JP2011/079449, mailed on Mar. 19, 2012.

*Primary Examiner* — Donald Raleigh
(74) *Attorney, Agent, or Firm* — Birch, Stewart, Kolasch & Birch, LLP

(57) ABSTRACT

A light-emitting device having an organic EL element that has a light-emitting surface and emits light from the light-emitting surface, and a structure layer disposed directly or indirectly on the light-emitting surface. The structure layer has, on a surface thereof that is opposite to the organic electroluminescent element, a concavo-convex structure including a first streak array extending in a first direction that is parallel to the surface, a second streak array extending in a second direction that is parallel to the surface and intersects with the first direction, and a third streak array extending in a third direction that is parallel to the surface and intersects with the first direction and the second direction.

7 Claims, 12 Drawing Sheets

(51) Int. Cl.
  *H01L 51/52* (2006.01)
  *F21K 99/00* (2010.01)

(56) References Cited

U.S. PATENT DOCUMENTS

| | | | |
|---|---|---|---|
| 2005/0280752 A1 | 12/2005 | Kim et al. | |
| 2006/0072342 A1 | 4/2006 | Kim et al. | |
| 2009/0116221 A1* | 5/2009 | Sato et al. | 362/97.1 |
| 2010/0177500 A1* | 7/2010 | Ohkawa et al. | 362/97.1 |

FOREIGN PATENT DOCUMENTS

| | | |
|---|---|---|
| JP | 2004-233957 A | 8/2004 |
| JP | 2005-221516 A | 8/2005 |
| JP | 2006-11439 A | 1/2006 |
| JP | 2006-276448 A | 10/2006 |
| JP | 2008-146886 A | 6/2008 |
| JP | 2010-117707 A | 5/2010 |
| JP | 2010-164715 A | 7/2010 |
| WO | WO 2004/017106 A1 | 2/2004 |

* cited by examiner

LIGHT-EMITTING ELEMENT

FIELD

The present invention relates to a light-emitting device. Specifically, the present invention relates to a light-emitting device including an organic electroluminescent element (appropriately referred to hereinbelow as an "organic EL element").

BACKGROUND

A light-emitting device including an organic EL element can be formed to have a planar shape, and the color of light emitted therefrom can be white or a color close to white. Therefore, it is contemplated that such light-emitting devices including organic EL elements are applicable as light sources of lighting devices for illuminating areas in living environments etc. or as backlight units of display devices.

However, the efficiency of currently known organic EL elements is insufficient for use in the aforementioned lighting applications. Therefore, it is desirable to improve the light extraction efficiency of organic EL elements. One known method for improving the light extraction efficiency of organic EL elements is to provide a variety of concavo-convex structures on the light-emitting surfaces of the organic EL elements. For example, there is a proposal in which a structure layer having a concavo-convex structure is provided on the light-emitting surface of an organic EL element (see Patent Literature 1). With this concavo-convex structure, light can be gathered in a favorable manner, and the light extraction efficiency can thereby be improved.

Techniques in Patent Literatures 2 and 3 are also known.

CITATION LIST

Patent Literature

Patent Literature 1: WO2004/017106
Patent Literature 2: Japanese Patent Application Laid-Open No. 2010-164715 A
Patent Literature 3: Japanese Patent Application Laid-Open No. 2005-221516 A

SUMMARY

Technical Problem

The conventional light-emitting devices having concavo-convex structures have a problem in that light incident from the outside of the devices is reflected on the surfaces of the concavo-convex structures, so that rainbow-like color unevenness (referred to hereinbelow as "rainbow unevenness") is observed. Such rainbow unevenness causes a reduction in the quality of the light-emitting device used as a light source, and therefore it is preferable to prevent the rainbow unevenness.

In the conventional light-emitting devices having concavo-convex structures, their appearance such as the color and brightness of the light-emitting surfaces of the light-emitting devices varies when an observer views the light-emitting devices from different azimuth angles. Therefore, there is another problem that the appearance of the light-emitting devices varies significantly at different positions of the user.

The present invention has been created in view of the foregoing problems, and it is an object of the present invention to provide a light-emitting device which has high light extraction efficiency, in which rainbow unevenness is reduced, and in which the change in appearance when an observer views the light-emitting device at different azimuth angles is reduced.

Solution to Problem

The present inventor has conducted intensive studies for solving the foregoing problems and found out that, when a concavo-convex structure layer having a concavo-convex structure on its surface opposite to an organic EL element is provided on the light-emitting surface of the organic EL element, light extraction efficiency can be improved by the concavo-convex structure. The present inventor has also found out that, when the concavo-convex structure includes a concavo-convex structure including three or more groups of streak arrays extending in different directions, the degree of occurrence of rainbow unevenness can be suppressed and the change in appearance when an observer views the light-emitting device at different azimuth angles can also be suppressed. The present invention has been completed on the basis of the aforementioned findings.

Accordingly, the present invention provides the following (1) to (6).
(1) A light-emitting device comprising: an organic electroluminescent element that has a light-emitting surface and emits light from the light-emitting surface; and a structure layer disposed directly or indirectly on the light-emitting surface of the organic electroluminescent element; wherein
 the structure layer includes, on a surface thereof that is opposite to the organic electroluminescent element, a concavo-convex structure including a first streak array extending in a first direction that is parallel to the surface, a second streak array extending in a second direction that is parallel to the surface and intersects with the first direction, and a third streak array extending in a third direction that is parallel to the surface and intersects with the first direction and the second direction.
(2) The light-emitting device according to (1), wherein the concavo-convex structure further includes a fourth streak array extending in a fourth direction that is parallel to the surface of the structure layer that is opposite to the organic electroluminescent element, and that intersects with the first direction, the second direction, and the third direction.
(3) The light-emitting device according to (1) or (2), wherein a shape of a cross section of each of the streak arrays that is obtained by cutting the streak array along a plane perpendicular to the extending direction thereof is a polygonal shape having three or more sides.
(4) The light-emitting device according to any one of (1) to (3), wherein the concavo-convex structure has a flat portion parallel to the light-emitting surface.
(5) The light-emitting device according to any one of (1) to (4), wherein the concavo-convex structure has inclined surfaces inclined with respect to the light-emitting surface, and
 an average inclination angles of the inclined surfaces with respect to the light-emitting surface is 55° or larger and 85° or smaller.
(6) The light-emitting device according to any one of (1) to (5), wherein the concavo-convex structure has three or more heights that are different from each other by 0.1 μm or larger.

Advantageous Effects of Invention

The light-emitting device of the present invention has high light extraction efficiency. In addition, rainbow unevenness thereof is reduced, and the change in appearance when an observer views the light-emitting device at different azimuth angles is reduced.

DESCRIPTION OF EMBODIMENTS

The present invention will be described in detail by way of embodiments, exemplifications, etc. However, the present invention is not limited to the following embodiments and exemplifications. The present invention may be embodied with any modifications as long as being within the scope of the claims of the present invention and equivalents thereof.

In the following description, directions "intersect" means that these directions are not parallel to each other.

1. First Embodiment

Figure 1:
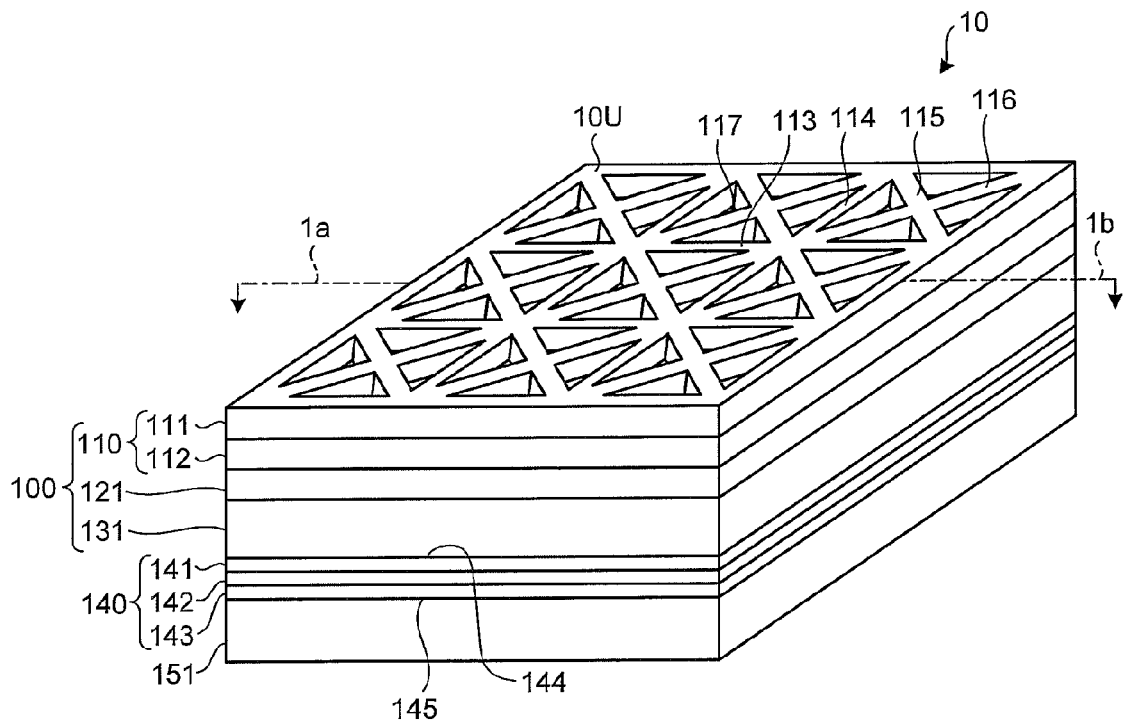
FIG. 1 is a perspective view schematically illustrating a light-emitting device according to a first embodiment of the present invention.
Figure 2:
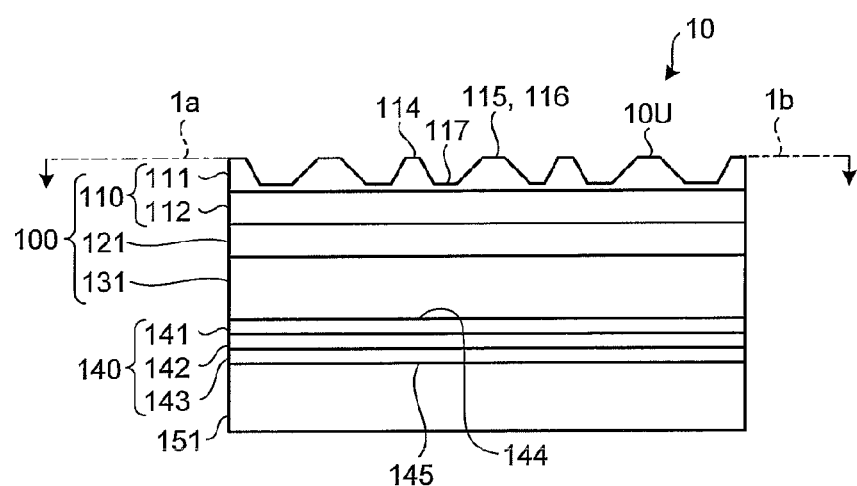
FIG. 2 is a cross-sectional view illustrating the light-emitting device according to the first embodiment of the present invention and is a view schematically illustrating a cross section obtained by cutting the light-emitting device shown in FIG. 1 along a plane including line 1a-1b and perpendicular to a light-emitting surface.

FIGS. 1 and 2 are views each illustrating a light-emitting device according to a first embodiment of the present invention. FIG. 1 is a perspective view schematically illustrating the light-emitting device, and FIG. 2 is a cross-sectional view schematically illustrating a cross section obtained by cutting the light-emitting device shown in FIG. 1 along a plane including line 1a-1b and perpendicular to a light-emitting surface.

As shown in FIG. 1, the light-emitting device 10 according to the first embodiment of the present invention is a device having a flat rectangular structure and includes an organic EL element 140. The organic EL element 140 includes at least a first electrode layer 141, a light-emitting layer 142, and a second electrode layer 143 in this order and is configured so as to be capable of emitting light from at least one of the surfaces 144 and 145 of the element 140. In the present embodiment, the first electrode layer 141 is a transparent electrode layer, and the second electrode layer 143 is a reflecting electrode layer. Therefore, the light generated in the light-emitting layer 142 passes through the first electrode layer 141 or is reflected on the second electrode layer 143, passes through the light-emitting layer 142 and the first electrode layer 141, and is then emitted to the outside from the surface 144. Therefore, in the following description, the surface 144 is referred to as a "light-emitting surface".

On the light-emitting surface 144 of the organic EL element 140, a light-emitting surface structure layer 100 serving as a structure layer of the present invention is provided. In the present embodiment, the light-emitting surface structure layer 100 is disposed so as to be in direct contact with the light-emitting surface 144. However, the light-emitting surface structure layer 100 may be disposed indirectly on the light-emitting surface 144 via a layer such as a bonding layer or a light diffusion layer.

The light-emitting device 10 of the present embodiment may further include constituent components other than the aforementioned components. In the present embodiment, a sealing substrate 151 is provided on the surface 145 of the organic EL element 140 that is on the lower side in the figure. Although not shown in the figure, any materials such as a filler and an adhesive may be present between the surface 145 and the sealing substrate 151, and a gap may be present therebetween. Air or other gases may be present in the gap, so long as a problem such as significant deterioration of the durability of the light-emitting layer 142 does not occur, or the gap may be vacuum.

Therefore, the light-emitting device 10 includes the sealing substrate 151, the organic EL element 140, and the light-emitting surface structure layer 100 in this order and allows light to be emitted through a surface 10U of the light-emitting surface structure layer 100 that is opposite to the organic EL element 140. The surface 10U is located on the outermost side of the light-emitting device 10, and the light is emitted to the outside of the light-emitting device 10 through the surface 10U. Therefore, the surface 10U is referred to as a "light-emitting surface".

[1-1. Organic EL Element]

As exemplified as the organic EL element 140, the organic EL element usually includes two or more electrode layers and a light-emitting layer that is disposed between these electrode layers and emits light when electric voltage is applied through the electrode layers.

Usually, the organic EL element has a structure obtained by forming the layers constituting the organic EL element such as the electrode layers and the light-emitting layers on a substrate and then providing a sealing member covering these layers so that the layers such as the light-emitting layer are sealed with the substrate and the sealing member. Usually, an organic EL element that emits light from the substrate side is referred to as a bottom emission type, and an organic EL element that emits light from the sealing member side is referred to as a top emission type. The organic EL element 140 provided in the light-emitting device 10 may be any of these types. In the case of the bottom emission type, a combination including the substrate and, if necessary, an optional layer usually forms the light-emitting surface structure layer. In the case of the top emission type, a combination including a structural body on the light-emitting surface side such as the sealing member and, if necessary, an optional layer usually forms the light-emitting surface structure layer.

No particular limitation is imposed on the light-emitting layer, and any known light-emitting layer may be appropriately selected. The number of types of light-emitting materials in the light-emitting layer is not limited to one, and a combination of two or more types of materials in any ratio may be used. The number of light-emitting layers is not limited to one, and one single layer or a combination of a plurality of layers may be used for adaptation to use as a light source. In this manner, white light or light of a color close to white can be emitted.

No particular limitation is imposed on the electrode layers of the organic EL element, and any known electrode layers may be appropriately selected. As in the organic EL element 140 according to the first embodiment, a transparent electrode layer may be used as the electrode layer 141 on a side close to the light-emitting surface structure layer 100, and a reflecting electrode layer may be used as the electrode layer 143 on the opposite side, to constitute an organic EL element that emits light from the light-emitting surface 144 toward the light-emitting surface structure layer 100. Alternatively, transparent electrodes may be used for both the electrode layers 141 and 143, and a reflecting member or a scattering member (for example, a white scattering member disposed via an air layer) may be provided on the side opposite to the light-emitting surface structure layer 100 so that light is emitted toward the light-emitting surface structure layer 100.

The organic EL element 140 may further include, in addition to the light-emitting layer 142, other layers (not shown), such as a hole injection layer, a hole transport layer, an electron transport layer, and an electron injection layer, disposed between the electrode layers 141 and 143. The organic EL element 140 may further include optional constituent components such as wiring leads for supplying electricity to the electrode layers 141 and 143 and a peripheral structure for sealing the light-emitting layer 142.

No particular limitation is imposed on the materials constituting the electrode layers and the layers disposed therebetween. Specific examples of such materials are as follows.

Examples of the material of the transparent electrode layer may include ITO (indium tin oxide).

Examples of the material of the hole injection layer may include starburst aromatic diamine compounds.

Examples of the material of the hole transport layer may include triphenyldiamine derivatives.

Examples of the host material of a yellow light-emitting layer may include triphenyldiamine derivatives, and examples of the dopant material of the yellow light-emitting layer may include tetracene derivatives.

Examples of the material of a green light-emitting layer may include pyrazoline derivatives.

Examples of the host material of a blue light-emitting layer may include anthracene derivatives, and examples of the dopant material of the blue light-emitting layer may include perylene derivatives.

Examples of the material of a red light-emitting layer may include europium complexes.

Examples of the material of the electron transport layer may include aluminum quinoline complexes (Alq).

Examples of the material of the reflecting electrode layer may include a stack of lithium fluoride and aluminum layers that is produced by sequentially depositing these layers by vacuum deposition.

The aforementioned light-emitting layers and other light-emitting layers may be suitably combined to obtain a stacked or tandem type light-emitting layers that generate light with complementary colors. The combination of complementary colors may be yellow-blue, green-blue-red, etc.

[1-2. Light-Emitting Surface Structure Layer]

The light-emitting surface structure layer 100 is a layer disposed on the light-emitting surface 144 of the organic EL element 140. The surface of the light-emitting surface structure layer 100 that is opposite to the organic EL element 140 is the light-emitting surface 10U. The light-emitting surface 10U is the outermost surface that is exposed on the light-emitting device 10 and is the light-emitting surface of the light-emitting device 10, i.e., a light-emitting surface through which light is emitted from the light-emitting device 10 to the outside of the device.

In a macroscopic sense, the light-emitting surface 10U is a surface parallel to the light-emitting surface 144 of the organic EL element 140 and is parallel to the principal surface of the light-emitting device 10. However, in a microscopic sense, the light-emitting surface 10U has a concavo-convex structure, so that sections corresponding to the surfaces of the concave and convex portions may form non-parallel angles with respect to the light-emitting surface 144. Therefore, unless otherwise specified, the phrase "parallel to or perpendicular to the light-emitting surface" in the following description means being parallel to or perpendicular to the light-emitting surface in a macroscopic sense with the concave or convex portions being ignored. Unless otherwise specified, the description of the light-emitting device 10 will be given with the device being placed so that the light-emitting surface 10U is in parallel to the horizontal and facing upward.

In addition, when constituent components are "parallel" or "perpendicular", a deviation within the range within, e.g., ±5°, in which the effects of the present invention are not impaired may be present. Unless otherwise specified, being "along" a certain direction means being "parallel" to this direction.

The light-emitting surface structure layer 100 includes a multi-layered body 110 including a concavo-convex structure layer 111 and a substrate film layer 112, a supporting substrate 131 serving as a substrate, and a bonding layer 121 for bonding the multi-layered body 110 and the supporting substrate 131.

The concavo-convex structure layer 111 is located at the top surface of the light-emitting device 10 (i.e., the outermost layer of the light-emitting device 10 on the light-emitting surface side). The concavo-convex structure layer 111 has a concavo-convex structure including a first streak array 113, a second streak array 114, a third streak array 115, and a fourth streak array 116. The term "streak array" means a group of plural rows of concave or convex portions extending continuously over a certain length in a certain direction. Therefore, the extending direction of the streak array means the extending direction of the concave or convex portions included in the streak array. A streak array may include, e.g., only concave portions formed in a groove shape, or may include, e.g., only convex portions formed in a ridge-like shape. Alternatively, a streak array may include a combination thereof. In the present embodiment, the first to fourth streak arrays 113 to 116 are composed of convex portions protruding relative to their surroundings. Therefore, between the first to fourth streak arrays 113 to 116, concave portions 117 recessed relative thereto are present. In the concavo-convex structure layer 111 of the present embodiment, the concavo-convex structure includes the concave portions 117 and the first to fourth streak arrays 113 to 116 including the convex portions, and the light-emitting surface 10U is defined by the concavo-convex structure.

In the present description, drawings are only schematic representations, and accordingly, the number of convex portions included in the first to fourth streak arrays 113 to 116 shown on the light-emitting surface 10U is small. However, in an actual light-emitting device, a much larger number of convex portions may be provided on the light-emitting surface 10U of a single light-emitting device.

(Description of Concavo-Convex Structure)

The concavo-convex structure of the light-emitting surface 10U will be described in detail hereinbelow with reference to the drawings.

Figure 3:
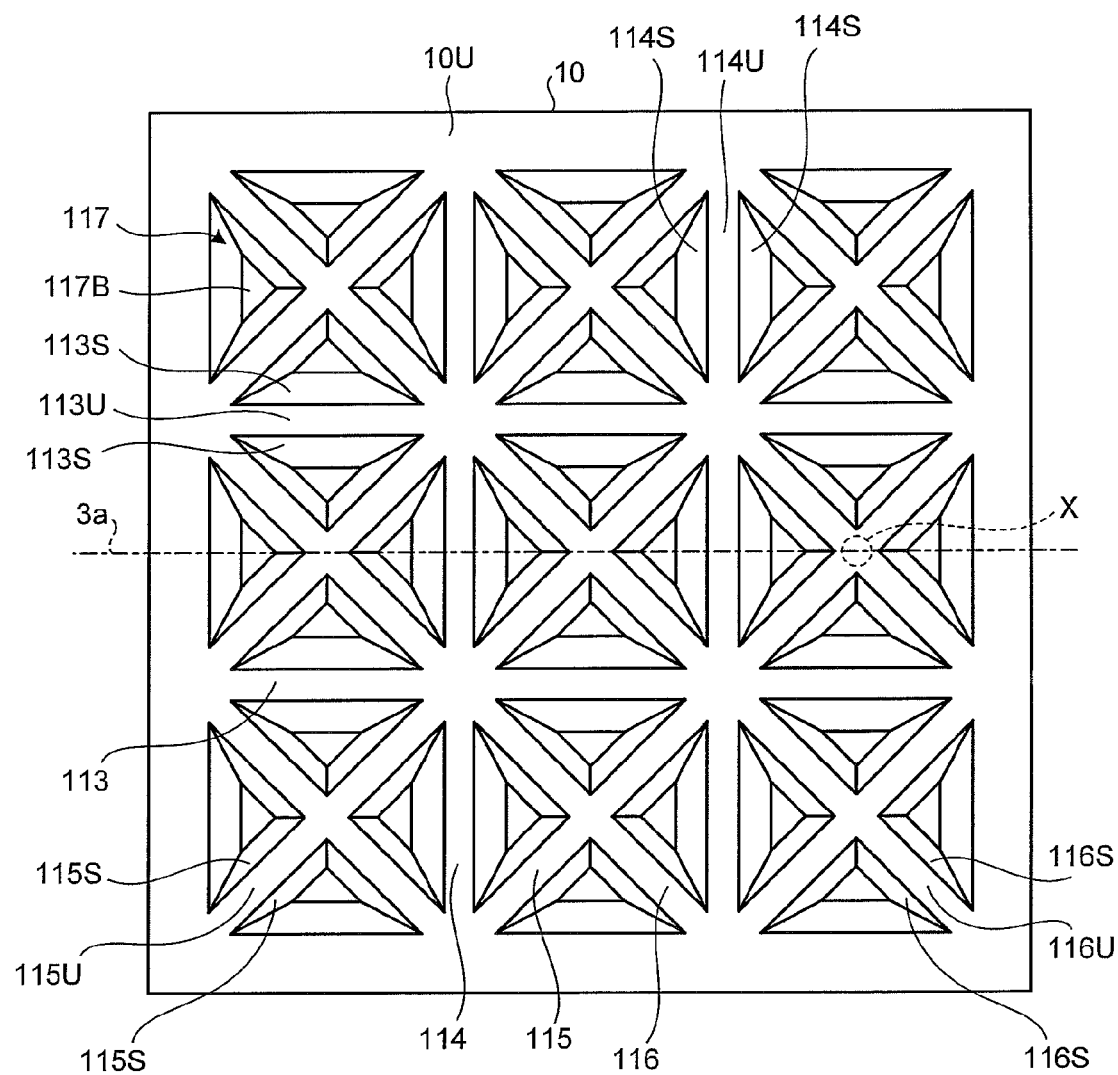
FIG. 3 is an enlarged plan view schematically illustrating the appearance of the light-emitting surface of the light-emitting device according to the first embodiment of the present invention, as viewed in the thickness direction of the light-emitting device.
Figure 4:
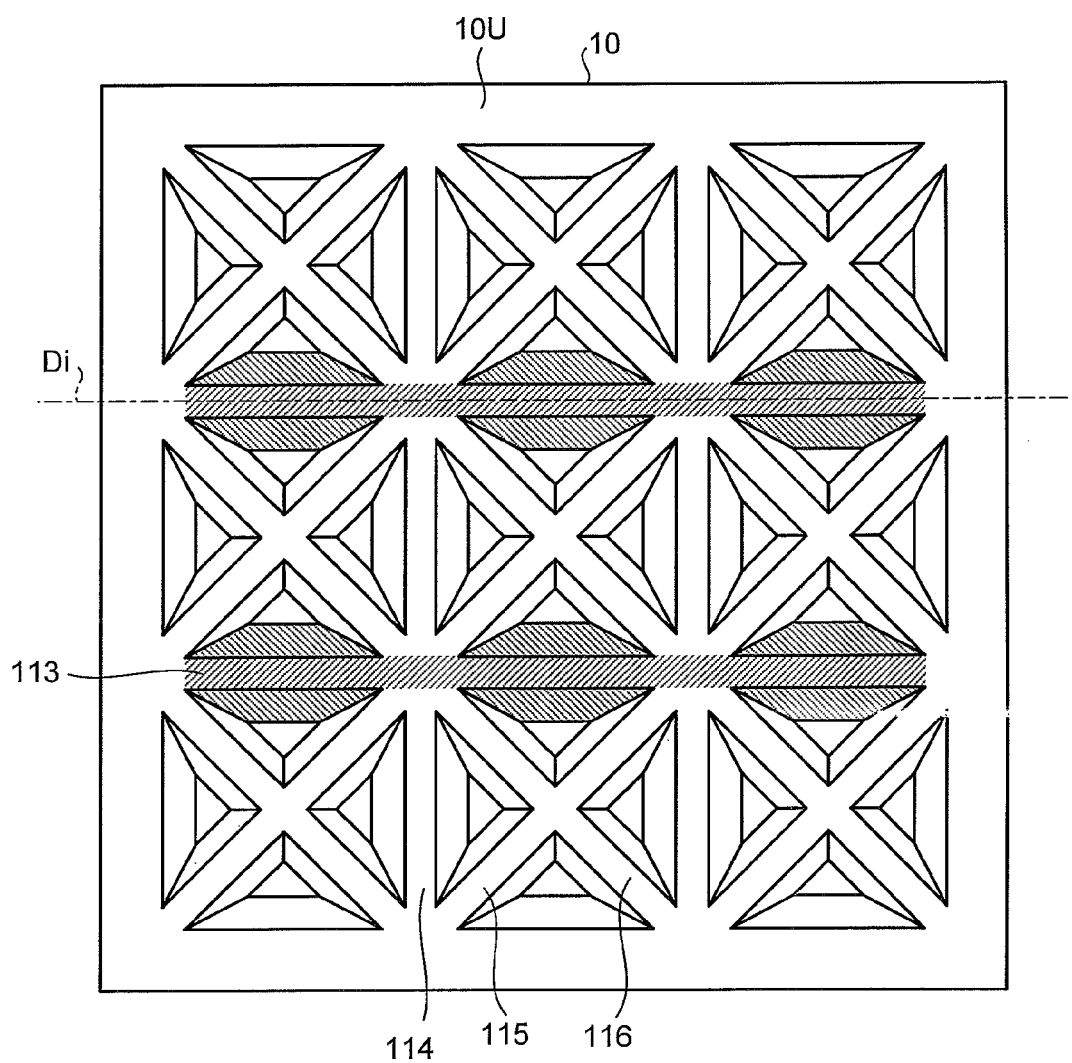
FIG. 4 is an enlarged plan view schematically illustrating the appearance of the light-emitting surface of the light-emitting device according to the first embodiment of the present invention, as viewed in the thickness direction of the light-emitting device.
Figure 5:
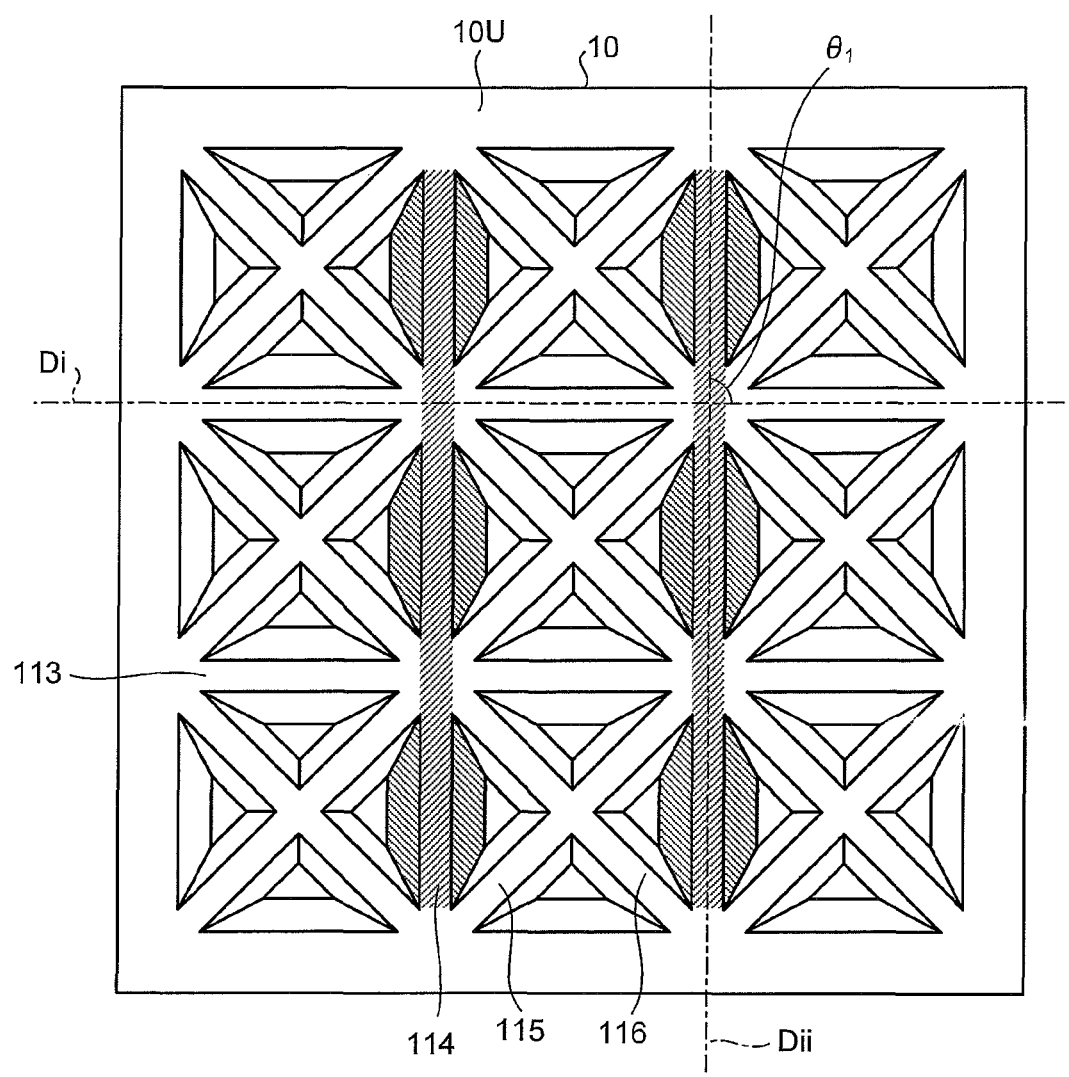
FIG. 5 is an enlarged plan view schematically illustrating the appearance of the light-emitting surface of the light-emitting device according to the first embodiment of the present invention, as viewed in the thickness direction of the light-emitting device.
Figure 6:
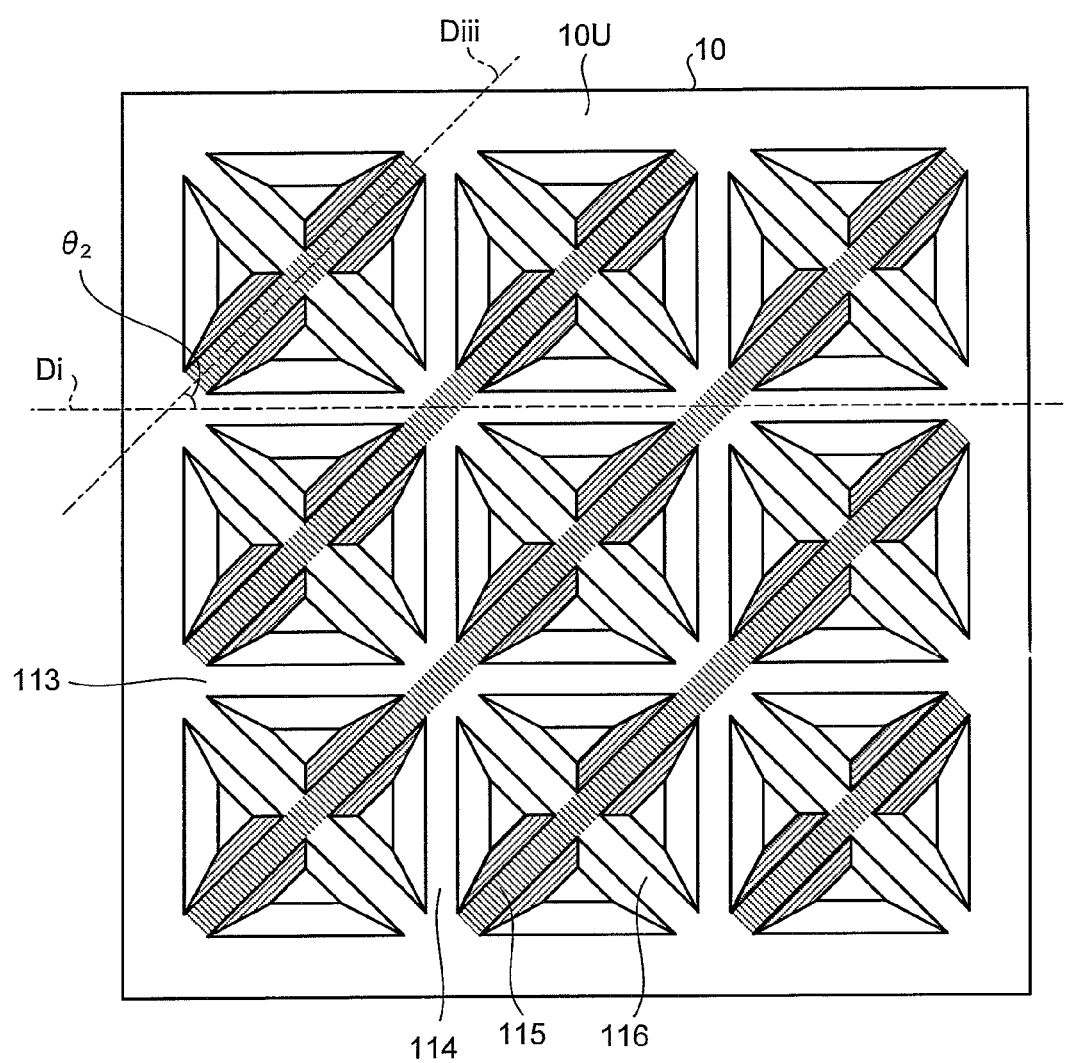
FIG. 6 is an enlarged plan view schematically illustrating the appearance of the light-emitting surface of the light-emitting device according to the first embodiment of the present invention, as viewed in the thickness direction of the light-emitting device.
Figure 7:
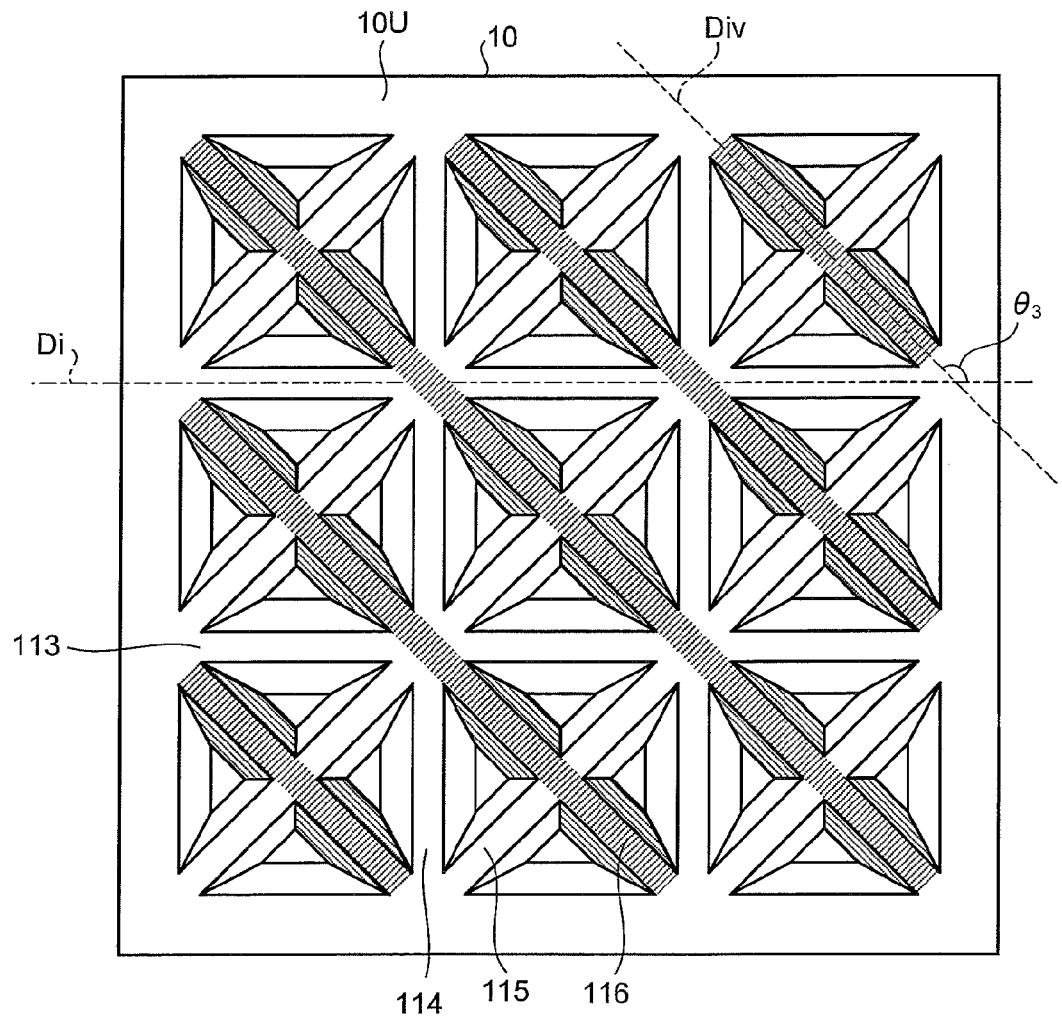
FIG. 7 is an enlarged plan view schematically illustrating the appearance of the light-emitting surface of the light-emitting device according to the first embodiment of the present invention, as viewed in the thickness direction of the light-emitting device.
Figure 8:
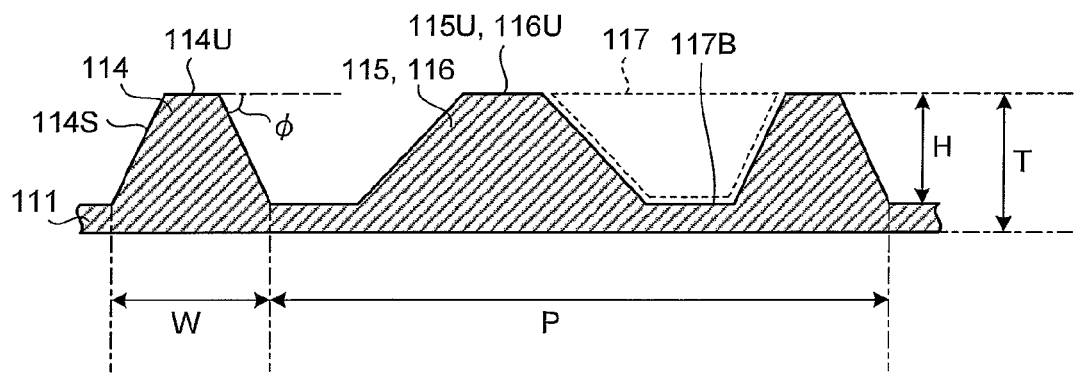
FIG. 8 is a partial cross-sectional view schematically illustrating a cross section obtained by cutting a part of a concavo-convex structure layer according to the first embodiment of the present invention along a plane including line 3a in FIG. 3 and perpendicular to the light-emitting surface.

FIGS. 3 to 7 are enlarged plan views schematically illustrating the appearance of the light-emitting surface 10U of the light-emitting device 10 according to the first embodiment of the present invention, as viewed in the thickness direction of the light-emitting device 10. FIG. 8 is a partial cross-sectional view schematically illustrating a cross section obtained by cutting a part of the concavo-convex structure layer 111 according to the first embodiment of the present invention along a plane including line 3a in FIG. 3 and perpendicular to the light-emitting surface 10U. In FIG. 3, line 3a is a line passing through intersections X of a third streak array 115 and a fourth streak array 116 and through concave portions 117 and parallel to the extending direction of the first streak array 113. In FIG. 4, the first streak array 113 is shown with shades. In FIG. 5, the second streak array 114 is shown with shade. In FIG. 6, the third streak array 115 is shown with shade. In FIG. 7, the fourth streak array 116 is shown with shade. In the following description, "the thickness direction" is the thickness direction of the light-emitting device 10, unless otherwise specified.

As shown in FIG. 3, the light-emitting surface structure layer 100 has four groups of streak arrays on the light-emitting surface 10U that extend in directions parallel to the light-emitting surface 10U, i.e., the first streak array 113, the second streak array 114, the third streak array 115, and the fourth streak array 116. All the first streak array 113, the second streak array 114, the third streak array 115, and the fourth streak array 116 extend in directions parallel to the light-emitting surface 10U. However, the extending directions of the first streak array 113, the second streak array 114, the third streak array 115, and the fourth streak array 116 are not parallel to each other but intersect each other. That is, when the extending direction of the first streak array 113 is defined as a first direction, the second streak array 114 extends in a second direction that intersects the first direction, the third streak array 115 extends in a third direction that crosses the first and second directions, and the fourth streak array 116 extends in a fourth direction that intersects the first, second, and third directions. The angles between these directions may be arbitrary set so long as the effects of the present invention are not significantly impaired. More specifically, the extending directions of the respective streak arrays 113 to 116 may intersect at an angle of usually 4° or larger, preferably 15° or larger, and more preferably 22.5° or lager and usually 176° or smaller, preferably 165° or smaller, and more preferably 157.5° or smaller. When there are four streak arrays with such angles, rainbow unevenness and the change in appearance when an observer views the light-emitting device at different azimuth angles can be effectively suppressed.

The foregoing description is about an instance with four groups of the streak arrays. However, when there are N groups of streak arrays (N is an integer of 3 or larger), the extending direction of an m-th streak array represented by a general expression may preferably be in the range of, $180°/N \times (m-1) \pm 180°/1.1N$, more preferably in the range of, $180°/N \times (m-1) \pm 180°/1.5N$, and particularly preferably in the range of, $180°/N \times (m-1) \pm 180°/2N$.

Here, m represents an integer of not less than 1 and not more than N. The aforementioned general expression represents the angle of the extending direction of the m-th streak array with respect to a reference direction defined as an angle of 0°.

In the present embodiment, the first streak array 113 is formed so as to extend in the first direction Di parallel to the light-emitting surface 10U, as shown in FIG. 4. As shown in FIG. 5, the second streak array 114 is formed so as to extend in the second direction Dii forming an angle $\theta_1$ with respect to the first direction Di in which the first streak array 113 extends. As shown in FIG. 6, the third streak array 115 is formed so as to extend in the third direction Diii forming an angle $\theta_2$ with respect to the first direction Di in which the first streak array 113 extends. As shown in FIG. 7, the fourth streak array 116 is formed so as to extend in the fourth direction Div forming an angle $\theta_3$ with respect to the first direction Di in which the first streak array 113 extends. The angles $\theta_1$ to $\theta_3$ may be larger than 0° and less than 180°. However, from the viewpoint of effectively suppressing rainbow unevenness and the change in appearance when an observer views the light-emitting device at different azimuth angles, the angles $\theta_1$ to $\theta_3$ are usually 4° or larger and less than 176°. The angles $\theta_1$ to $\theta_3$ are different from each other and are preferably different from each other by 4° or more, as described above. In the present embodiment, $\theta_1$ is set to 90°, $\theta_2$ is set to 45°, and $\theta_3$ is set to 135°.

The shapes of cross sections obtained by cutting the first to fourth streak arrays 113 to 116 along planes perpendicular to the extending directions of the streak arrays 113 to 116 may be, e.g., rectangular or semicircular shapes but are preferably polygonal shapes with three or more sides. This is because polygonal shapes provides good mold removability which facilitates molding of the streak arrays 113 to 116, and also because the intended optical properties strongly depend on the angles of inclined surfaces 113S to 116S. The intended optical properties strongly depend on the angles of inclined surfaces 113S to 116S herein means that, e.g., the collection of light is facilitated when the angles of the inclined surfaces 113S to 116S are about 45° and that the color tone of the light emitted from the device can be easily made uniform when the angles are 55° or larger. Particularly, from the viewpoint of improving the chipping resistance of the streak arrays 113 to 116 to improve the durability of the concavo-convex structure layer 111, it is preferable that the cross sections have polygonal shapes with four or more sides. The cross-sectional shape of a streak array means the shape of the concave portions or convex portions (the convex portions in the present embodiment) constituting the streak array in the aforementioned cross section of the streak array.

In the present embodiment, the shapes of cross sections obtained by cutting the first to fourth streak arrays 113 to 116 along planes perpendicular to the extending directions of the streak arrays 113 to 116 are quadrangular trapezoids (more specifically, isosceles trapezoids), as shown in FIG. 8. Therefore, as shown in FIG. 1, the first to fourth streak arrays 113 to 116 have flat portions 113U to 116U serving as most protruding portions, and the flat portions 113U to 116U correspond to the upper sides of the aforementioned trapezoids. The first to fourth streak arrays 113 to 116 also have pairs of inclined surfaces 113S to 116S corresponding to the non-parallel opposing sides of the trapezoids, and the flat portions 113U to 116U are interposed between the inclined surfaces 113S to 116S.

The term "inclined surface" refers to a surface inclined with respect to the light-emitting surface 10U, i.e., a surface forming a non-parallel angle with respect to the light-emitting surface 10U. The angle of the inclined surface is the angle formed by the inclined surface with respect to the light-emitting surface 10U. The surfaces of the flat portions 113U to 116 are flat surfaces parallel to the light-emitting surface 10U. The flat portions 113U to 116U have the effect of improving the durability of the concavo-convex structure, as described above. In addition, e.g., the flat portions 113U to 116U allow the light emitted from the organic EL element 140 and repeatedly reflected until the light is extracted to the air to be reflected in a variety of directions, so that they bring about the effect of improving the light extraction efficiency. The light that has emitted from the organic EL element 140 but was unable to be extracted through the flat portions 113U to 116U can be extracted through the inclined surfaces 113S to 116S to the outside. Therefore, by providing the inclined surfaces 113S to 116S, the light extraction efficiency of the light-emitting device 10 can be improved.

As described above, each of the first to fourth streak arrays 113 to 116 includes a plurality of convex portions, and these convex portions are disposed at predetermined intervals. Therefore, the concave portions 117 recessed relative to their surroundings are present between the streak arrays 113 to 116. That is, the light-emitting surface 10U has the plurality of concave portions 117 disposed thereon, and the concave portions 117 are formed in a discretely dispersed manner separated by the streak arrays 113 to 116.

As shown in FIG. 8, the bottom of each concave portion 117 is a flat portion 117B that is a flat surface parallel to the light-emitting surface 10U. If dust and broken pieces are accumulated on the concave portions 117, a reduction in the light extraction efficiency may occur, and bright spots may be generated. However, since the bottoms of the concave portions 117 are the flat portions 117B having a flat shape, dust, broken pieces, etc. are less likely to be accumulated on the concave portions 117.

In the first to fourth streak arrays 113 to 116, the dimensions such as height H, width W, and pitch P of the concave or convex portions included in the streak arrays 113 to 116 may be arbitrary set, so long as the effects of the present invention are not significantly impaired. For example, the height H is usually 1 μm or higher and preferably 2 μm or higher and usually 50 μm or lower and preferably 40 μm or lower. The width W is usually 1 μm or larger and preferably 2 μm or larger and usually 60 μm or smaller and preferably 50 μm or smaller. The pitch P is usually 0.5 μm or larger and preferably 1 μm or larger and usually 2 mm or smaller and preferably 1 mm or smaller.

In each of the concave or convex portions included in the first to fourth streak arrays 113 to 116, the dimensions such as the height H, width W, and pitch P may be constant or may vary depending on positions in the extending direction. In the present embodiment, the dimensions of the convex portions in all the streak arrays 113 to 116 are constant in their extending directions.

The dimensions of the concave or convex portions included in the same one of the streak arrays 113 to 116 may be the same or different. In the present embodiment, the dimensions of the convex portions included in the same one of the streak arrays 113 to 116 are constant.

The dimensions of the concave or convex portions included in different ones of the streak arrays 113 to 116 may be the same of different. In the present embodiment, the heights H and widths W of the convex portions in all the streak arrays 113 to 116 are constant. The sizes of the pitches P are adjusted such that all the third streak array 115 and the fourth streak array 116 pass through the intersections of the first streak array 113 and the second streak array 114. Therefore, the shapes of the concave portions 117 as viewed in the thickness direction are the same for all the concave portions 117, and the flat portions 117B at the bottoms of all the concave portions 117 are triangular.

When the average angle φ of the inclined surfaces 113S to 116S of the first to fourth streak arrays 113 to 116 with respect to the flat portions 113U to 116U (and therefore with respect to the light-emitting surface 10U) (the average is appropriately referred to hereinbelow as an "average inclination angle") is within the range of 45°±10°, light is suitably collected in a front direction. However, for the purpose of suppressing a change in color tone at different observation angles, the average inclination angle is preferably 55° or larger and more preferably 60° or larger and preferably 85° or smaller and more preferably 70° or smaller. By setting the average inclination angle φ of the inclined surfaces 113S to 116S to be equal to or larger than the lower limit of the aforementioned range, the light extraction efficiency can be improved while the change in color tone at different observation angles (polar angles) is suppressed to thereby suppress rainbow unevenness. By setting the average inclination angle φ of the inclined surfaces 113S to 116S to be equal to or smaller than the upper limit of the aforementioned range, the durability of the concavo-convex structure layer 111 can be improved.

In the present embodiment, the angles of all the inclined surface portions 113S to 116S with respect to the light-emitting surface 10U are set to be identical. However, the angles may vary.

The light extraction efficiency of the light-emitting device 10 can be improved by appropriately adjusting the ratio of the area occupied by the flat portions 113U to 116U and 117B when the concavo-convex structure layer 111 is observed in the thickness direction relative to the sum of the area occupied by the flat portions 113U to 116U and 117B and the area occupied by the inclined surfaces 113S to 116S (this ratio is appropriately referred to hereinbelow as a "flat portion ratio"). More specifically, by setting the flat portion ratio to 10% to 75%, favorable light extraction efficiency can be obtained, and the mechanical strength of the light-emitting surface 10U can be improved.

The thickness T of the concavo-convex structure layer 111 shown in FIG. 8 may be set within an appropriate range in relation to the height H of the concave or convex portions included in the first to fourth streak arrays 113 to 116. For example, when a hard material advantageous for maintaining the durability of the concavo-convex structure layer 111 is used as the material of the concavo-convex structure layer 111, it is preferable to reduce the thickness T of the concavo-convex structure layer 111, because the flexibility of the light-emitting device 10 can be improved, so that the concavo-convex structure layer 111 can be easily handled in a process of producing the light-emitting device 10. More specifically, the difference between the thickness T of the concavo-convex structure layer 111 and the height H of the concave or convex portions included in the streak arrays 113 to 116 is preferably 0 to 30 μm.

(Description of Materials of Multi-Layered Body)

The light-emitting surface structure layer 100 may be composed of a plurality of layers but may also be composed of a single layer. From the viewpoint of easily obtaining a light-emitting surface structure layer 100 having the desired characteristics, the light-emitting surface structure layer 100 is preferably composed of a plurality of layers. In the present embodiment, the light-emitting surface structure layer 100 includes the multi-layered body 110 formed by combining the concavo-convex structure layer 111 and the substrate film layer 112, as shown in FIG. 1. In this manner, a high-performance light-emitting surface structure layer 100 can be easily obtained.

The concavo-convex structure layer 111 and the substrate film layer 112 are usually formed from a resin composition containing a transparent resin. The term "transparent" in the transparent resin means that the resin has a light transmittance suitable for use as an optical member. In the present embodiment, each of the layers constituting the light-emitting surface structure layer 100 may have a light transmittance suitable for use as the optical members. For example, the light-emitting surface structure layer 100 may have the total light transmittance as a whole of 80% or higher.

No particular limitation is imposed on the transparent resins contained in the resin compositions. A variety of resins that can form a transparent layer may be used. Examples of such a resin may include thermoplastic resins, thermosetting resins, ultraviolet curable resins, and electron beam-curable resins. Of these, thermoplastic resins can be easily deformed by heat, and ultraviolet curable resins have high curability and high efficiency. Therefore, these resins are preferred because therewith the concavo-convex structure layer 111 can be efficiently formed.

Examples of the thermoplastic resins may include polyester-, polyacrylate-, and cycloolefin polymer-based resins. Examples of the ultraviolet curable resins may include epoxy-, acrylic-, urethane-, ene/thiol-, and isocyanate-based resins. As these resins, those having a plurality of polymerizable functional groups may be preferably used. As the aforementioned resin, one species thereof may be solely used, or two or more species thereof may be used in combination at any ratio.

Particularly, a material having high hardness after curing is preferred as the material of the concavo-convex structure layer 111 constituting the multi-layered body 110, because such a material can easily form the concavo-convex structure of the light-emitting surface 10U and can easily provide the concavo-convex structure having abrasion resistance. More specifically, it is preferable to use a material that forms a resin layer having a pencil hardness of HB or higher when the resin layer having a thickness of 7 μm with no concavo-convex structure is formed on a substrate. A material that forms the layer having a pencil hardness of H or higher is more preferred, and a material that forms the layer having a pencil hardness of 2H or higher is still more preferred. It is preferable that the material of the substrate film layer 112 has a certain degree of flexibility in order to facilitate handling of the substrate film layer 112 when the concavo-convex structure layer 111 is formed and to facilitate handling of the multi-layered body 110 after the formation of the multi-layered body 110. Use of a combination of such materials gives a multi-layered body 110 that can easily be handled and has high durability, and therefore facilitates production of the light-emitting device 10 having a high-performance.

Such a combination of materials may be obtained by selecting, as the resins constituting respective materials, appropriate resins from the transparent resins exemplified above. More specifically, an ultraviolet curable resin such as an acrylate is preferably used as the transparent resin constituting the material of the concavo-convex structure layer 111, and a film made of an alicyclic olefin polymer (such as a ZEONOR Film manufactured by ZEON CORPORATION) or a polyester film is preferably used as the transparent resin constituting the material of the substrate film layer 112.

When the light-emitting surface structure layer 100 includes the concavo-convex structure layer 111 and the substrate film layer 112 as in the present embodiment, the refractive index of the concavo-convex structure layer 111 may be as close as possible to the refractive index of the substrate film layer 112. In this case, the difference in refractive index between the concavo-convex structure layer 111 and the substrate film layer 112 is preferably 0.1 or smaller and more preferably 0.05 or smaller.

Light-diffusible materials may be used as the materials of the layers serving as the constituent components of the light-emitting surface structure layer 100, such as the concavo-convex structure layer 111 and the substrate film layer 112. By using such light-diffusible materials, the light passing through the light-emitting surface structure layer 100 can be diffused, and the change in color tone at different observation angles can thereby be further reduced.

Examples of the light-diffusible material may include a material containing particles and an alloy resin that includes a mixture of two or more types of resins to have light diffusing ability. Of these, a material containing particles is preferred from the viewpoint that the light diffusivity can be easily controlled, and a resin composition containing particles is particularly preferred.

The particles may be transparent or may be non-transparent. Examples of the material of the particles may include metals, metal compounds, and resins. Examples of the metal compounds may include metal oxides and nitrides. Specific examples of the metal and metal compounds may include: metals having high reflectivity such as silver and aluminum; and metal compounds such as silicon oxide, aluminum oxide, zirconium oxide, silicon nitride, tin-doped indium oxide, and titanium oxide. Examples of the resins may include methacrylic resins, polyurethane resins, and silicone resins. As the materials of the particles, one species thereof may be solely used, or two or more species thereof may be used in combination at any ratio.

The particles may have a shape such as a spherical, cylindrical, needle-like, cubic, cuboidal, pyramid, conical, or star-like shape.

The diameter of the particles is preferably 0.1 μm or larger and preferably 10 μm or smaller and more preferably 5 μm or smaller. The particle diameter is a 50% particle diameter in a cumulative distribution which is obtained by adding up the volume-based amount of particles along the horizontal axis representing the particle diameter. The larger the particle diameter is, the larger the ratio of the amount of particles that is necessary to obtain the desired effects is. The smaller the particle diameter is, the smaller the necessary amount is. Therefore, the smaller the particle diameter is, the less the amount of particles that is necessary to obtain the desired effects such as a reduction in the change in color tone at different observation angles and an improvement in light extraction efficiency is. When the shape of the particles is other than spherical, the diameters of spheres having the same volumes as those of the particles are used as their particle diameters.

When the particles are transparent particles and are contained in a transparent resin, the difference in refractive index between the particles and the transparent resin is preferably 0.05 to 0.5 and more preferably 0.07 to 0.5. Either of the particles and the transparent resin may have a higher refractive index than the other. If the refractive index of the particles is too close to that of the transparent resin, the diffusion effect may not be obtained and suppression of color tone unevenness may become insufficient. On the contrary, if the difference is too large, although high diffusion may be obtained and color tone unevenness may be suppressed, the light extraction effect may be reduced.

The containing ratio of the particles in terms of the volume ratio relative to the total volume of the particle containing layer is preferably 1% or larger and more preferably 5% or larger and preferably 80% or smaller and more preferably 50% or smaller. By setting the containing ratio of the particles to be not less than the aforementioned lower limit, the desired effects such as a reduction in the change in color tone at different observation angles can be obtained. By setting the containing ratio to be not more than the aforementioned upper limit, aggregation of the particles can be prevented, so that the particles can be stably dispersed.

If necessary, the resin composition may contain an optional component. Examples of the optional component may include additives such as: antidegradants such as phenol-based and amine-based antidegradants; antistatic agents such as surfactant-based and siloxane-based antistatic agents; and light resistant agents such as triazole-based and 2-hydroxybenzophenone-based light resistant agents.

No particular limitation is imposed on the thickness T of the concavo-convex structure layer 111, but the thickness T is preferably 1 μm to 70 μm. In the present embodiment, the thickness T of the concavo-convex structure layer 111 is the distance between its surface facing the substrate film layer 112 with no concavo-convex structure formed thereon and the flat portions 113U to 116U of the concavo-convex structure.

The thickness of the substrate film layer 112 is preferably 20 μm to 300 μm.

(Supporting Substrate)

The light-emitting device 10 of the present embodiment has the supporting substrate 131 between the organic EL element 140 and the multi-layered body 110. The provision of the supporting substrate 131 allows the light-emitting device 10 to have stiffness for suppressing warpage. The substrate for use as the supporting substrate 131 may be a substrate which has a high ability to seal the organic EL element 140, and may also be a substrate on which sequential formation of layers constituting the organic EL element 140 in the production process can be easily performed. By using such a substrate, the durability of the light-emitting device 10 can be improved, and production process thereof can be facilitated.

Examples of the material constituting the supporting substrate 131 may include glass and resins. As the material of the supporting substrate 131, one species thereof may be solely used, or two or more species thereof may be used in combination at any ratio.

No particular limitation is imposed on the refractive index of the supporting substrate 131, but the refractive index is preferably 1.4 to 2.0.

No particular limitation is imposed on the thickness of the supporting substrate 131, but the thickness is preferably 0.1 mm to 5 mm.

(Bonding Layer)

The light-emitting device 10 of the present embodiment has the bonding layer 121 between the multi-layered body 110 and the supporting substrate 131. The bonding layer 121 is interposed between the substrate film layer 112 and the supporting substrate 131 in the multi-layered body 110 and is a layer that bonds these two layers.

An adhesive used as the material of the bonding layer 121 is not limited to an adhesive in a narrow sense (a so-called hot-melt adhesive having a shear storage modulus at 23° C. of 1 to 500 MPa and exhibiting no adhesion at room temperature) but includes a tackiness agent having a shear storage modulus at 23° C. of smaller than 1 MPa. Specifically, a transparent adhesive having a refractive index close to that of the supporting substrate 131 or the substrate film layer 112 may be appropriately used. More specific examples thereof may include acrylic adhesives or tackiness agents. The thickness of the bonding layer is preferably 5 μm to 100 μm.

(Production Method)

No particular limitation is imposed on the method for producing the light-emitting device 10. For example, the light-emitting device 10 may be produced by stacking the respective layers constituting the organic EL element 140 on one surface of the supporting substrate 131, and before or after these layers are stacked, bonding the multi-layered body 110 including the concavo-convex structure layer 111 and the substrate film layer 112 onto the other surface of the supporting substrate 131 through the bonding layer 121.

The multi-layered body 110 having the concavo-convex structure layer 111 and the substrate film layer 112 may be produced by, e.g., preparing a mold such as a metal mold having a desired shape and transferring this shape to the layer of a material for forming the concavo-convex structure layer 111. Specific examples of the method may include:

(method 1) a method including preparing an unprocessed multi-layered body having a layer of a resin composition A for constituting the substrate film layer 112 and a layer of a resin composition B for constituting the concavo-convex structure layer 111 (concavo-convex structure has not been formed yet at this point) and forming a concavo-convex structure on the surface of the resin composition B in the unprocessed multi-layered body; and (method 2) a method including applying the resin composition B in liquid form onto the substrate film layer 112, placing a mold on the applied resin composition B, and curing the resin composition B keeping that state, to form the concavo-convex structure layer 111.

In the method 1, the unprocessed multi-layered body may be obtained by, e.g., extrusion molding in which the resin composition A and the resin composition B are co-extruded. Then a mold having a desired surface shape is pressed against the surface of the resin composition B in the unprocessed multi-layered body, whereby the concavo-convex structure is formed.

More specifically, a long unprocessed multi-layered body may be formed in a continuous manner by extrusion molding, and the multi-layered body is then pressed between a transfer roller having the desired surface shape and a nip roller. This allows continuous production in an efficient manner. The nipping pressure between the transfer roller and the nip roller is preferably several MPa to several tens of MPa. Preferably, the temperature during transfer is equal to or higher than Tg and equal to or lower than (Tg+100° C.), wherein Tg is the glass transition temperature of the resin composition B. The time for the contact of the unprocessed multi-layered body and the transfer roller may be adjusted by the feeding speed of the film, i.e., the rotation speed of the rollers, and is preferably 5 seconds or longer and 600 seconds or shorter.

In the method 2, it is preferable to use, as the resin composition B for constituting the concavo-convex structure layer 111, a composition that is curable with energy rays such as ultraviolet rays. Such a resin composition B is applied onto the substrate film layer 112, and irradiation with energy rays such as ultraviolet rays is performed from a light source positioned on the opposite side of the coated surface with the mold placed on the resin composition B, to cure the resin composition B. Then the mold is removed, to thereby obtain the multi-layered body 110 in which the coating of the resin composition B serves as the concavo-convex structure layer 111. The opposite side of the coated surface is a side of the substrate film that is opposite to the surface thereof onto which the resin composition B has been applied.

(Main Advantages of the Light-Emitting Device)

The light-emitting device 10 of the present embodiment is configured as described above. Therefore, the light emitted from the light-emitting surface 144 of the organic EL element 140 passes through the light-emitting surface structure layer 100 and is extracted through the light-emitting surface 10U. Since the light-emitting surface 10U has the concavo-convex structure including the first to fourth streak arrays 113 to 116 and the concave portions 117, the light that cannot be extracted through the flat portions 113U to 116U and 117B can be extracted through the inclined surfaces 113S to 116S. Therefore, the light extraction efficiency from the light-emitting surface 10U can be improved as compared to that when no concavo-convex structure is provided.

The light-emitting device 10 has the first to fourth streak arrays 113 to 116 on the light-emitting surface 10U, whereby rainbow unevenness is reduced, and the change in appearance when an observer views the light-emitting device at different azimuth angles is also reduced. The reason why the aforementioned effects can be obtained is not clear. However, according to studies by the present inventor, the reason may be as follows.

In a conventional light-emitting device, even when a concavo-convex structure is provided on the light-emitting surface, concave and convex portions in the concavo-convex structure have been typically provided so as to extend along only two orthogonal in-plane directions, and therefore the concavo-convex structure has bade a high regularity. Therefore, interference and diffraction have occurred because of the periodic structure of the inclined surfaces included in the concavo-convex structure, and this may be the reason why the severe rainbow unevenness has occurred. However, when the streak arrays 113 to 116 extending in three or more different directions are provided in the light-emitting surface 10U as in the present embodiment, the relative areas of the inclined surfaces 113S to 116S oriented in the specific directions are reduced, and this may be the reason why the rainbow unevenness caused by the aforementioned periodic structure can be suppressed.

In the conventional light-emitting device, since the concave and convex portions are typically provided only along two orthogonal in-plane directions as described above, optical properties (such as brightness and color tone) observed at an azimuth angle vary significantly depending on the observation azimuth angle. This may be the reason why the change in appearance at different azimuth angles is large. However, when the streak arrays 113 to 116 extending in three or more different directions are provided in the light-emitting surface 10U as in the present embodiment, the regularity of the concavo-convex structure of the light-emitting surface 10U are reduced. Therefore, the optical properties do not largely vary when the light-emitting device is viewed from all azimuth angles. This may be the reason why appearance at different azimuth angles are equalized. When the number of the streak array groups 113 to 116 is increased, a larger amount of light is diffused by the streak arrays 113 to 116 than in the conventional case. Such light diffusion may also be one of the factors that can cause reduction in the change in appearance at different azimuth angles.

In a conventional light-emitting device having a flat surface on its light-emitting surface, interference of light reflected from the flat surface may cause unevenness observed on the light-emitting surface. However, when the streak arrays 113 to 116 extending in three or more different directions are provided on the light-emitting surface 10U as in the present embodiment, the interference by the flat portions 113U to 116U and 117B is dispersed, so that the occurrence of the unevenness due to interference can be suppressed.

These effects may be obtained when at least three groups of the streak arrays are provided. However, more remarkable effects may be obtained when more groups of the streak arrays are provided. Therefore, it is more preferable to provide four or more groups of the streak arrays as in the present embodiment than to provide only three groups of the streak arrays.

Moreover, with the light-emitting device 10 of the present embodiment, the light-emitting surface 10U is prevented from, e.g., being chipped by an external impact, and therefore the mechanical strength of the light-emitting surface 10U can be improved. Generally, when a surface has a concavo-convex structure and an impact is applied to the surface, its force tends to concentrate on a part of the concavo-convex structure to cause breakage. However, the light-emitting device 10 of the present embodiment has the flat portions 113U to 116U having a flat shape at the outermost in the thickness direction. Therefore, when a force or impact is applied from the outside to the light-emitting surface 10U, the concentration of force on a part of the concavo-convex structure layer 111 can be suppressed, so that the concavo-convex structure layer 111 can be prevented from being broken and the mechanical strength of the light-emitting device 10 can be improved.

2. Second Embodiment

In the light-emitting device of the present invention, the concavo-convex structure of the light-emitting surface may be in a form of having three or more different heights. In this case, it is preferable that the difference between any of the heights of the concavo-convex structure is 0.1 μm or larger. When the concavo-convex structure of the light-emitting surface has three or more heights that are different from each other by 0.1 μm or larger, the concavo-convex structure of the light-emitting surface has dimensional differences larger than the dimensional difference that causes interference of one or both of emission light emitted through the light-emitting surface and reflected light reflected on the light-emitting surface. In this manner, rainbow unevenness caused by the interference of one or both of these emission light and reflected light can be effectively suppressed. The differences in height in the concavo-convex structure may be 0.1 μm or larger and may also be, e.g., 0.15 μm or larger or 0.2 μm or larger. No particular limitation is imposed on the upper limit of the differences in height in the concavo-convex structure. However, since too large difference may increase thickness of the light-emitting device, the upper limit of the differences in height in the concavo-convex structure is preferably 50 μm or smaller and may be, e.g., 25 μm or smaller or 10 μm or smaller.

The heights in the concavo-convex structure mean positions in the thickness direction of the light-emitting surface other than the inclined surfaces. Usually, the heights are the positions of the most protruding parts of convex portions included in a streak array in the thickness direction and the positions of the bottoms of concave portions provided between the convex portions included in the streak array in the thickness direction. The emission light emitted through the light-emitting surface includes not only the light emitted from the organic EL element but also light that has entered into the light-emitting device through the light-emitting surface, then reflected in the light-emitting device, and then emits after again passing through the light-emitting surface.

An example of the heights will be described hereinbelow with reference to the drawings.

Figure 9:
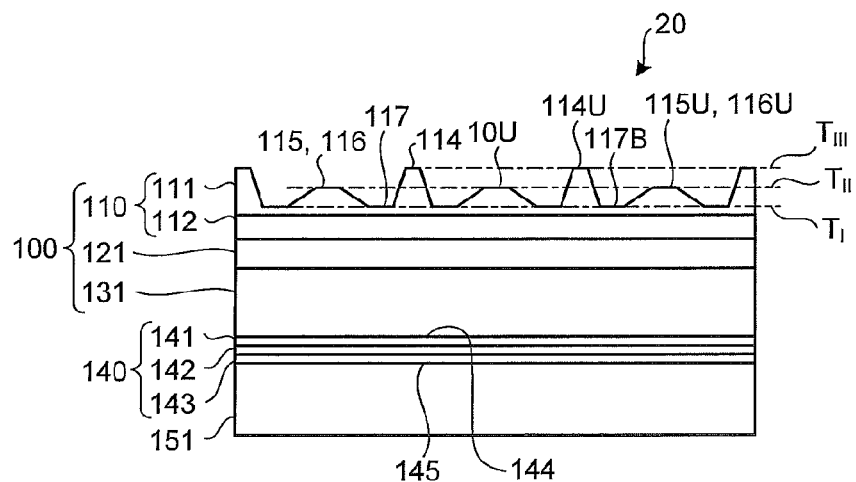
FIG. 9 is a cross-sectional view schematically illustrating a cross section obtained by cutting a light-emitting device according to a second embodiment of the present invention along a plane perpendicular to the light-emitting surface and containing a line that passes through intersections of a third streak array and a fourth streak array and through concave portions and is parallel to the extending direction of a first streak array.

FIG. 9 is a cross-sectional view schematically illustrating a cross section obtained by cutting a light-emitting device 20 according a second embodiment of the present invention along a plane perpendicular to the light-emitting surface 10U and containing a line that passes through intersections of the third streak array 115 and the fourth streak array 116 and through concave portions 117 and is parallel to the extending direction of the first streak array 113. In the second embodiment, the same components as those in the first embodiment are denoted by the same symbols as those in the first embodiment.

As shown in FIG. 9, the light-emitting device 20 according to the second embodiment of the present invention has the same configuration as that of the light-emitting device 10 according to the first embodiment except that the height of the convex portions included in the first streak array 113 (see FIG. 1) and the second streak array 114 is different from the height of the convex portions included in the third streak array 115 and the fourth streak array 116. More specifically, the height of the convex portions included in the third streak array 115 and the fourth streak array 116 is lower than the height of the convex portions included in the first streak array 113 and the second streak array 114. Therefore, the concavo-convex structure of the light-emitting surface 10U has three heights, height $T_I$, height $T_{II}$, and height $T_{III}$. The height $T_I$ represents the positions of the flat portions 117B on the bottoms of the concave portions 117 in the thickness direction. The height $T_{II}$ represents the positions of the flat portions 115U of the third streak array 115 and the flat portions 116 of the fourth streak array 116 in the thickness direction. The height $T_{III}$ represents the positions of the flat portions 113U of the first streak array 113 and the flat portions 114U of the second streak array 114 in the thickness direction.

The height of the convex portions included in the third streak array 115 and the fourth streak array 116 is set to 0.1 μm or higher. The difference between the height of the convex portions included in the first streak array 113 and the second streak array 114 and the height of the convex portions included in the third streak array 115 and the fourth streak array 116 is also set to 0.1 μm or larger. Therefore, the three heights $T_I$ to $T_{III}$ included in the concavo-convex structure of the light-emitting surface 10U are different from each other by 0.1 μm or larger.

In this case, the differences between the three heights $T_I$ to $T_{III}$ included in the concavo-convex structure of the light-emitting surface 10U are the dimensional differences of the concavo-convex structure exceeding the difference that causes interference of one or both of the emission light and reflected light, and therefore color unevenness due to interference can be suppressed. That is, interference of the emission light and the reflected light at the flat portions 113U and 114U, the flat portions 115U and 116U, and the flat portions 117B positioned at different heights is suppressed, so that rainbow unevenness can be effectively suppressed. In this case, these effects can be obtained when the dimensional differences $T_{III}-T_{II}$ and $T_{II}-T_I$ are set so as to exceed the difference that causes interference of the emission light. However, usually, the reflected light tends to have a larger influence on rainbow unevenness than the emission light. Therefore, when the dimensional differences are set so as to exceed the difference that causes the interference of the reflected light, more remarkable effects can be obtained.

For example, in the case of interference of the emission light emitted from the organic EL element 140, the dimensional differences exceeding the difference that causes the interference are dimensional differences of usually 0.62 times or more times the center wavelength of the emission light and preferably 1.5 times or more times the center wavelength. When such dimensional differences are provided, the occurrence of rainbow unevenness can be suppressed. The upper limit of these dimensional differences is not particularly limited but is preferably equal to or smaller than 60 times the center wavelength of the emission light.

The aforementioned numerical range has been verified by the following findings. In an instance of a structure layer designed such that all the flat portions have the same depth in the concave portions, suppose that, when the error in the depth of the concave portions is 170 nm or larger, interference occurs, and rainbow unevenness is observed. It has been found out that, in such an instance, the occurrence of the rainbow unevenness can be suppressed by intentionally providing a dimensional difference in height 2 times or more times the minimum error that causes the rainbow unevenness. In addition, in an instance of a structure layer designed such that all the flat portions have the same depth in the concave portions, suppose that, when the depth of the concave portions fluctuates with a standard deviation of σ1 nm (60 nm), interference occurs, and rainbow unevenness is observed. It has been found out that, in such an instance, the occurrence of rainbow unevenness can be suppressed by intentionally providing a dimensional difference in height equal to or larger than 6×σ1 nm (=360 nm). The aforementioned two findings show that the dimensional difference larger than the difference that causes interference of emission light is 0.62 times or more times the center wavelength of the light emitted from the light-emitting device.

For the same reason, as to the interference of transmission light and reflected light, the dimensional difference larger than the difference that causes the interference is usually 0.62 times or more times and preferably 1.5 times or more times the center wavelength of the transmission light and reflected light. The dimensional difference is usually equal to or smaller than 60 times the center wavelength. However, usually, the transmission light and reflected light is natural light and can include any wavelength. Therefore, it is difficult to determine the center wavelength of the reflected light. In view of the fact that the light causing the rainbow unevenness is visible light, 550 nm, which is the center wavelength of visible light, is usually used as the center wavelength of the reflected light to set the aforementioned dimensional differences.

When the concavo-convex structure has three or more different heights $T_I$, $T_{II}$, and $T_{III}$ that are different from each other by 0.1 μm or larger as in the present embodiment, the same advantages as those in the first embodiment can also be obtained. When the heights H of all the convex portions included in the streak arrays 113 to 116 are uniform as in the first embodiment, rainbow unevenness due to interference is unlikely to occur. However, in actual products, it may be difficult to make the heights H of the convex portions included in the streak arrays 113 to 116 highly uniform, because of changing in production conditions such as temperature and humidity. Therefore, by intentionally providing the different heights $T_I$, $T_{II}$, and $T_{III}$ to the concavo-convex structure in the aforementioned manner, rainbow unevenness can be more easily suppressed.

3. Third Embodiment

In each of the aforementioned first and second embodiments, a light-emitting device of the single sided light-emission type in which only one side of the light-emitting device serves as the light-emitting surface has been described as an example. However, the light-emitting device of the present invention may be a light-emitting device of the double side light-emission type in which both sides of the light-emitting device serve as light-emitting surfaces. An example of such a device will be described hereinbelow with reference to the drawing.

Figure 10:
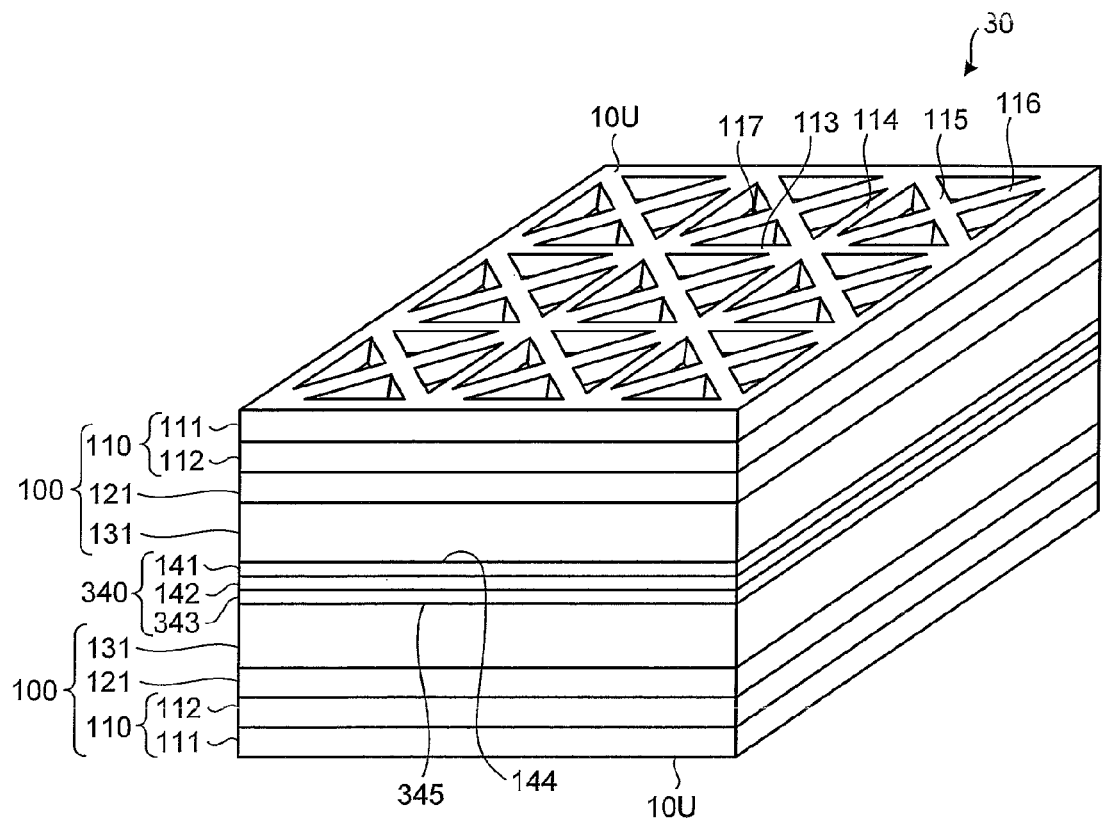
FIG. 10 is a perspective view schematically illustrating a light-emitting device according to a third embodiment of the present invention.

FIG. 10 is a perspective view schematically illustrating a light-emitting device according to a third embodiment of the present invention. In the third embodiment, the same components as those in the first embodiment are denoted by the same symbols as those in the first embodiment.

As shown in FIG. 10, the light-emitting device 30 according to the third embodiment has the same configuration as in the first embodiment except that the device has an organic EL element 340 including a second electrode layer 343 which is a transparent electrode in place of the second electrode layer 143 serving as the reflecting electrode and that a light-emitting surface structure layer 100 is provided in place of the sealing substrate 151. Between the second electrode 343 and the light-emitting surface structure layer 100 on the lower side in the figure, any optional material such as a filler and an adhesive may be present, and a gap may be present. Air or other gases may be present in the gap, so long as a problem such as significant deterioration of the durability of the light-emitting layer 142 does not occur, or the gap may be vacuum.

Since the second electrode layer 343 is a transparent electrode, the light from the light-emitting layer 142 passes through the first electrode layer 141 and the second electrode layer 343 and is emitted through the two light-emitting surfaces 10U on the lower and upper sides in the figure. Therefore, a surface 345 of the organic EL element 340 on the lower side in the figure also serves as a light-emitting surface. When light is emitted through the front and back surfaces as described above, the same advantages as in the first embodiment can also be obtained.

In the light-emitting device 30 of the present embodiment, light incident on one of the light-emitting surfaces 10U usually passes through the light-emitting device 30 and is then emitted through the other light-emitting surface 10U. Therefore, the opposite side can be viewed with naked eyes through the light-emitting device 30, and a see-through type light light-emitting device can be achieved. This allows diversification of the design. Such a see-through type light light-emitting device is required to have transparency, and therefore the optimal values of the angles of the inclined surfaces etc. are different from those in the first embodiment. In addition, the number of streak array groups is preferably 4 groups or more and more preferably 6 groups or more. The lower limit of the angles of the inclined surfaces of the streak arrays (the angles may be the average inclination angle) is preferably 70° or larger and more preferably 80° or larger, and the upper limit is preferably 87.5° or smaller and more preferably 85° or smaller. If the angles are too small, haze may become large. If the angles are too large, the extraction efficiency may be reduced, and workability may deteriorate.

4. Other

The embodiments of the present invention have been described above, but the present invention is not limited to the aforementioned embodiments and may be embodied with further modifications.

For example, in the aforementioned embodiments, the light-emitting surface structure layer 100 is disposed so as to be in direct contact with the light-emitting surface 144. However, the light-emitting surface structure layer 100 may be disposed on the light-emitting surface 144 via other layers. Examples of such other layers may include a gas barrier layer for protecting the organic EL element 140 from the outside air and humidity and an ultraviolet-cut layer for shielding ultraviolet rays.

For example, in the aforementioned embodiments, the light-emitting surface structure layer 100 includes the concavo-convex structure layer 111, the substrate film layer 112, the bonding layer 121, and the supporting substrate 131. However, the light-emitting surface structure layer 100 may be composed of a smaller number of layers or may further include an optional layer in addition to these layers. For example, the light-emitting surface structure layer 100 may further have a coating layer on the surface of the concavo-convex structure layer 111, and the coating layer may define the concavo-convex structure of the light-emitting surface 10U.

Figure 11:
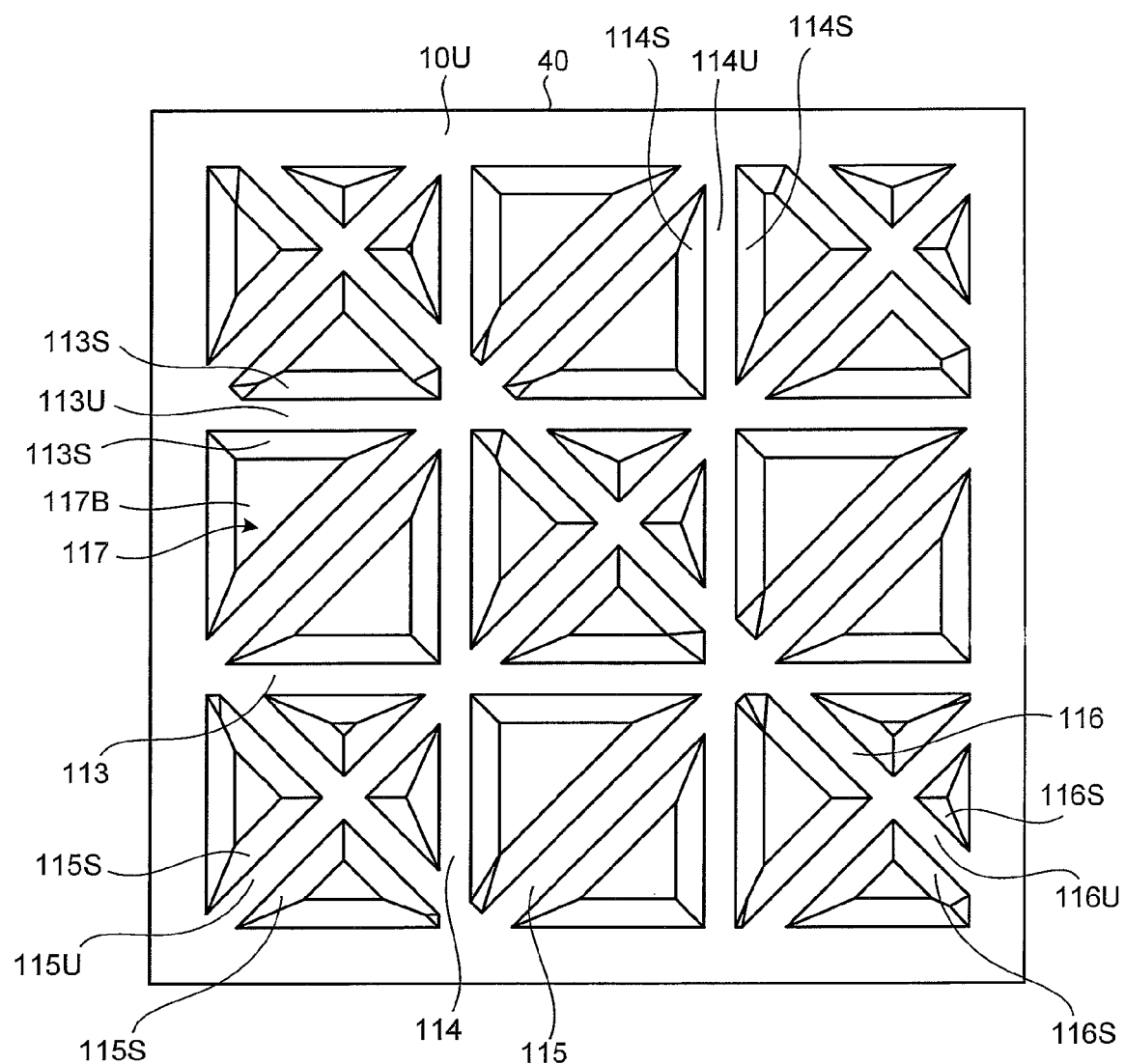
FIG. 11 is an enlarged plan view schematically illustrating the appearance of the light-emitting surface of a light-emitting device according to a modification of the first embodiment of the present invention, as viewed in the thickness direction of the light-emitting device.

For example, in the aforementioned embodiments, the third streak array 115 and the fourth streak array 116 pass through the intersections of the first streak array 113 and the second streak array 114, so that the first to fourth streak arrays 113 to 116 intersect at single intersections. This may be changed as follows. For example, the first to fourth streak arrays 113 to 116 may not intersect at single intersections, as in a light-emitting device 40 shown in FIG. 11. As specific examples, the pitch width of any of the streak arrays may be set to be nonuniform, or the positions or extending directions of the streak arrays may be set to be different from those in the aforementioned embodiments. In this manner, the regularity of the light-emitting surface 10U may be further reduced, whereby rainbow unevenness and the change in appearance when an observer views the light-emitting device at different azimuth angles can be more effectively reduced. FIG. 11 is an enlarged plan view schematically illustrating the appearance of a light-emitting surface 10U of the light-emitting device 40 according to a modification of the first embodiment of the present invention, as viewed in the thickness direction of the light-emitting device 40. In FIG. 11, the same components as those in the first embodiment are denoted by the same symbols as those in the first embodiment.

For example, in the examples shown in the aforementioned embodiments, all the first to fourth streak arrays 113 to 116 include convex portions protruding from their surroundings. However, the first to fourth streak arrays 113 to 116 may include concave portions recessed from their surroundings. A streak array including convex portions and also a streak array including concave portions may coexist on a single light-emitting surface.

Moreover, the concave or convex portions included in the first to fourth streak arrays may be formed in a shape having rounded edges.

For example, in the light-emitting device having the reflecting electrode in any of the aforementioned embodiments, when the reflecting electrode is replaced with a combination of a transparent electrode and a reflecting layer, a light-emitting device having the same effects as those of the reflecting electrode can also be configured.

In the second embodiment, height of the convex portions included in the first streak array 113 and the second streak array 114 are increased, and height of the convex portions included in the third streak array 115 and the fourth streak array 116 are reduced, so that the concavo-convex structure of the light-emitting surface 10U has different heights. However, the concavo-convex structure of the light-emitting surface 10U having different heights may be embodied by another structure. For example, only height of the convex portion included in the first streak array 113 may be increased, and height of the convex portions included in the second to fourth streaks 114 to 116 may be reduced. As another example, the positions of the flat portions 117B on the bottoms of the concave portions 117 in the thickness direction may be made nonuniform such that the position of the flat portion 117B on the bottom of a concave portion 117 is different from the position of the flat portion 117B on the bottom of another concave portion 117 by 0.1 μm or larger in the thickness direction. Moreover, e.g., the heights of the convex portions included in one streak array may be made nonuniform, or the height of a single convex portion may be made nonuniform, to thereby allow the concavo-convex structure of the light-emitting surface 10U to have different heights.

In the third embodiment, the identical light-emitting surface structure layers 100 are provided on the light-emitting surfaces 144 and 345 of the organic EL element 340. However, a combination of different light-emitting surface structure layers may be used for the light-emitting surface 144 and the light-emitting surface 345. In a light-emitting device of the double side light-emission type, when a light-emitting surface structure layer is provided on at least one of the light-emitting surfaces, the other light-emitting surface may be without a light-emitting surface structure layer.

5. Lighting Device and Backlight Device

The light-emitting device of the present invention may be applicable for uses such as a lighting device and a backlight device.

The lighting device includes the light-emitting device of the present invention as a light source and, if necessary, further includes optional components such as a member for holding the light source and a circuit for supplying electric power.

The backlight device includes the light-emitting device of the present invention as a light source and, if necessary, further includes optional components such as an enclosure, a circuit for supplying electric power, a diffusion plate for further improving the uniformity of the emitted light, a diffusion sheet, and a prism sheet. The applications of the backlight device may include display devices, such as liquid crystal display devices, for displaying images by controlling pixels and backlights for display devices, such as signboards, for displaying still images.

EXAMPLES

The present invention will be specifically described hereinbelow by way of Examples. However, the present invention is not limited to the following Examples. The present invention may be embodied with any modifications within the scope of the claims of the present invention and equivalents thereof. The refractive indices of resins described in the following description are the refractive indices after curing.

Reference Example 1

Production of Multi-Layered Body

A UV(ultraviolet) curable resin (urethane acrylate resin, refractive index n=1.54) was applied onto a substrate film (ZEONOR film, manufactured by ZEON CORPORATION, thickness: 100 μm, refractive index n=1.53). Then UV ray irradiation was performed from the substrate film side at an accumulated light quantity of 1,000 mJ/cm$^2$ to cure the UV curable resin, whereby a urethane acrylate resin layer (thickness: 15 μm) was formed on the substrate film. A multi-layered body which was a rectangular film having a layered structure of (substrate film)/(urethane acrylate resin layer) was thereby obtained.

(Production of Light-Emitting Device)

A white organic EL element which had a front chromaticity was (0.318, 0.365) and in which maximum values of color change in the polar angle range of 0° to 80° were (Δx, Δy)= (0.035, 0.051) was prepared. The multi-layered body was bonded to the light-emitting surface of the prepared organic EL element via an adhesive (acrylic resin, refractive index: 1.49, CS9621, manufactured by NITTO DENKO Corporation). A light-emitting device including the organic EL element, the bonding layer, and the multi-layered body in this order and having no concavo-convex structure on the surface opposite to the organic EL element (the light-emitting surface) was thereby obtained.

(Measurement of Optical Properties)

Figure 12:
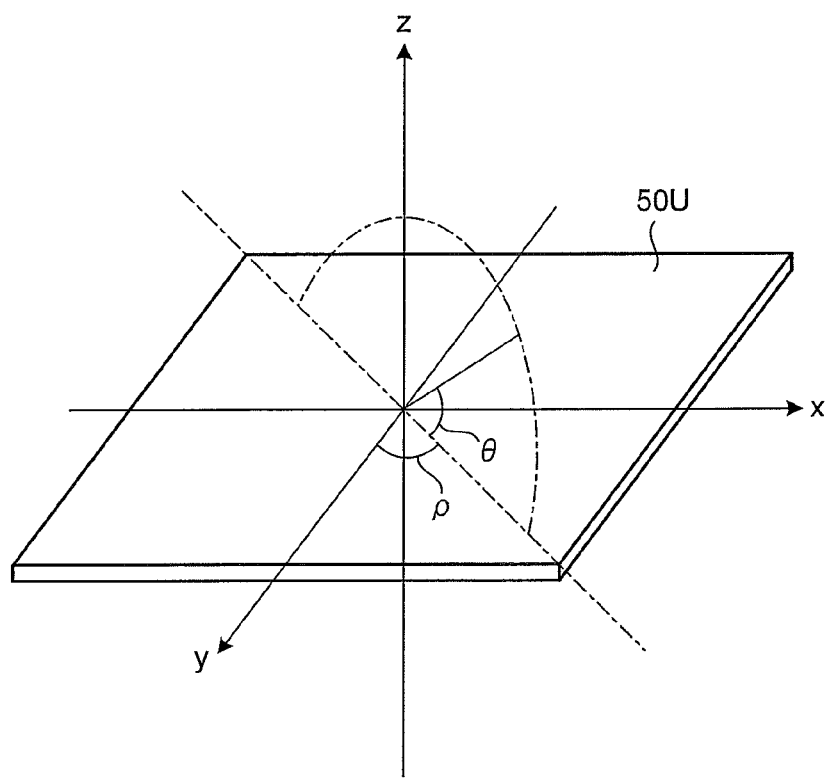
FIG. 12 is a view for explaining a method for evaluating optical properties in Examples, Comparative Examples, and a Reference Example.
Figure 13:
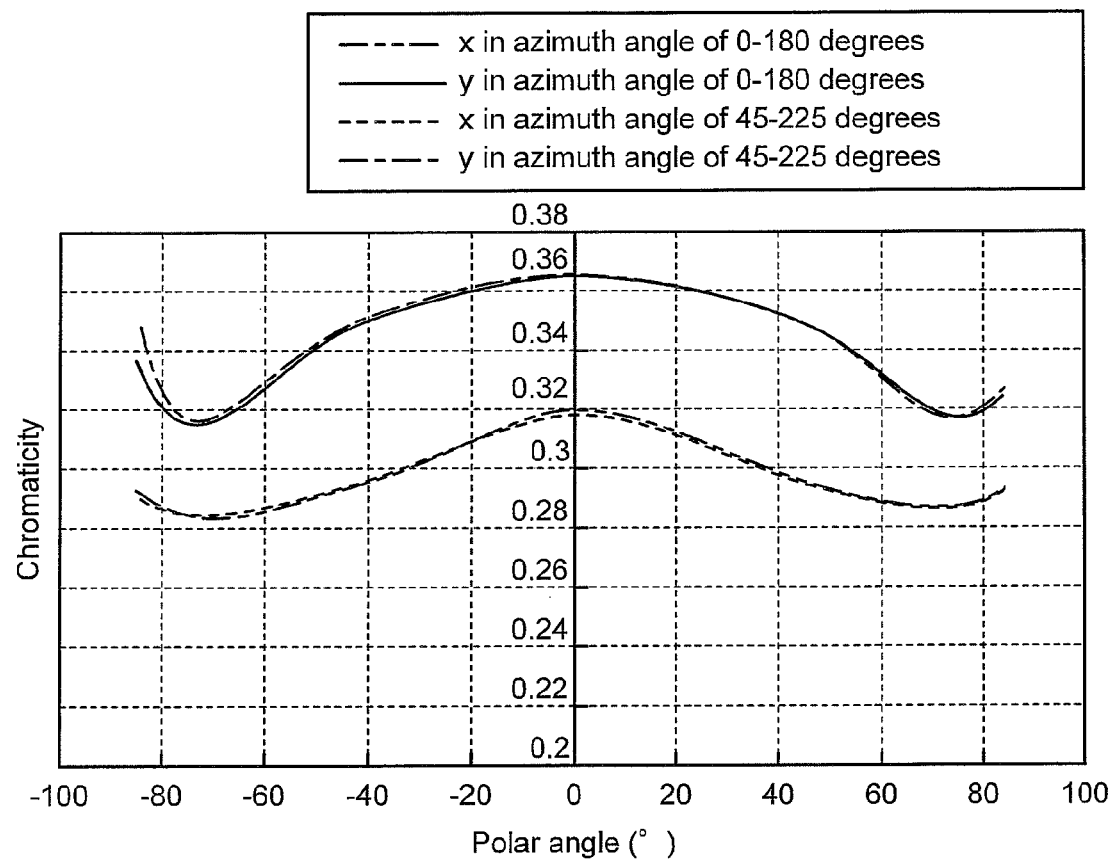
FIG. 13 is a graph showing the results of chromaticity measurement in Reference Example 1.

The aforementioned light-emitting device was attached to a rotatable supporting device. A spectral radiance luminometer (BM-5, manufactured by TOPCON Corporation) was placed in front of (in the direction normal to) the light-emitting surface of light-emitting device. A constant current of 100 mA/m² was applied to the light-emitting device. Keeping the state of light emission, chromaticity (x, y) and brightness were measured while the light-emitting device was rotated to change the observation direction of the spectral radiance luminometer with respect to the light-emitting surface. As shown in FIG. 12, one in-plane direction in a light-emitting surface 50U was set to be an x axis, the in-plane direction in the light-emitting surface 50U orthogonal to the x axis was set to be a y axis, and the direction normal to the light-emitting surface 50U was set to be a z axis. In this coordinate system, the polar angle θ of the observation direction was changed in the range of −85° to +85°. The measurement was performed two times, i.e., at an azimuth angle ρ of 0° to 180° and at an azimuth angle ρ of 45° to 225°. The results of the measurement of chromaticity (x, y) are shown in FIG. 13.

Comparative Example 1

Production of Multi-Layered Body

A concavo-convex structure layer (thickness: 15 μm) was formed on a substrate film in the same manner as in Reference Example 1 except that after the UV curable resin was applied onto the substrate film, a metal mold having a predetermined shape was pressed against the coating layer of the resin when the resin was cured. A multi-layered body which was a rectangular film having a layered structure of (substrate film)/ (concavo-convex structure layer) was thereby obtained.

Figure 14:
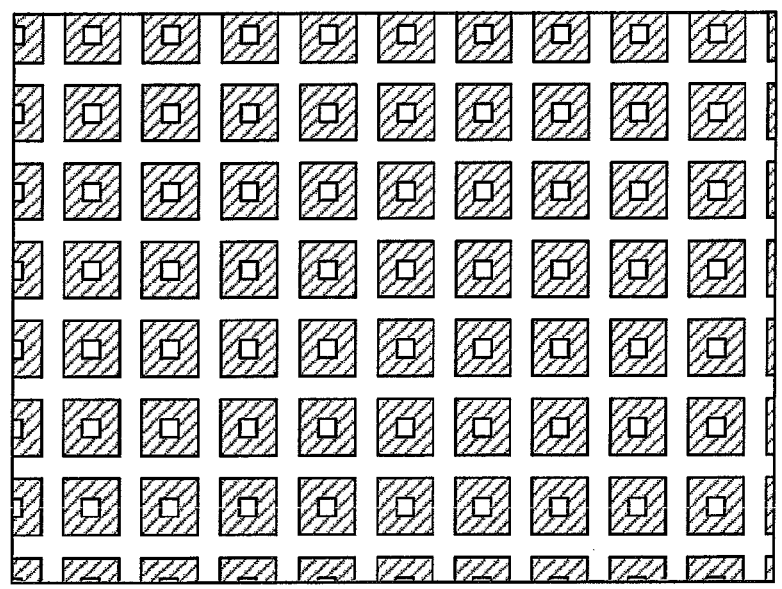
FIG. 14 is a view schematically illustrating the appearance of a part of a concavo-convex structure layer produced in Comparative Example 1, as viewed in the thickness direction.

FIG. 14 schematically illustrates the appearance of a part of the concavo-convex structure layer produced in Comparative Example 1, as viewed in a thickness direction. In FIG. 14, white portions represent flat portions, and shaded portions represent inclined surfaces. As shown in FIG. 14, in the multi-layered body in Comparative Example 1, the concavo-convex structure on the surface of the concavo-convex structure layer had two groups of streak arrays extending in two mutually orthogonal directions in a plane parallel to the surface and was composed of a plurality of concave portions having a truncated square pyramid shape (i.e., a shape obtained by cutting an apex portion of a square pyramid along a plane parallel to the bottom) and flat portions located around the concave portions. Each streak array included a plurality of convex portions disposed along a certain direction. A cross sectional shape of the streak array obtained by cutting the streak array along a plane perpendicular to the extending direction of the streak array was trapezoidal, and all the inclination angles of the inclined surfaces included in the streak array was 60°. The most protruding parts of the respective streak arrays were flat portions, and the width of the flat portions was 5 μm. The bottom of each concave portion was a square flat portion, and the length of the sides of the square was 15 μm. In addition, the height of each convex portion was 9 μm.

(Evaluation of Rainbow Unevenness)

The obtained multi-layered body was placed with the surface having the concavo-convex structure formed thereon facing upward. With a linear light source fluorescent lamp, light irradiation onto the surface having the concavo-convex structure formed thereon was performed. The surface having the concavo-convex structure formed thereon was observed from obliquely upward direction, and a rainbow moire was observed.

(Production of Light-Emitting Device)

A light-emitting device including an organic EL element, a bonding layer, and the multi-layered body in this order and having a concavo-convex structure on the surface opposite to the organic EL element (light-emitting surface) was obtained in the same manner as in Reference Example 1 except that the multi-layered body obtained in Comparative Example 1 was used as the multi-layered body.

(Measurement of Optical Properties)

The chromaticity (x, y) and brightness were measured with the obtained light-emitting device in the same manner as in Reference Example 1. The results of the measurement of chromaticity (x, y) are shown in FIG. 15.

As a result of the measurement, in Comparative Example 1, the light extraction efficiency was improved by 10% and the front brightness was improved by 10% as compared to the results in Reference Example 1. The front chromaticity was (0.311, 0.359).

Figure 15:
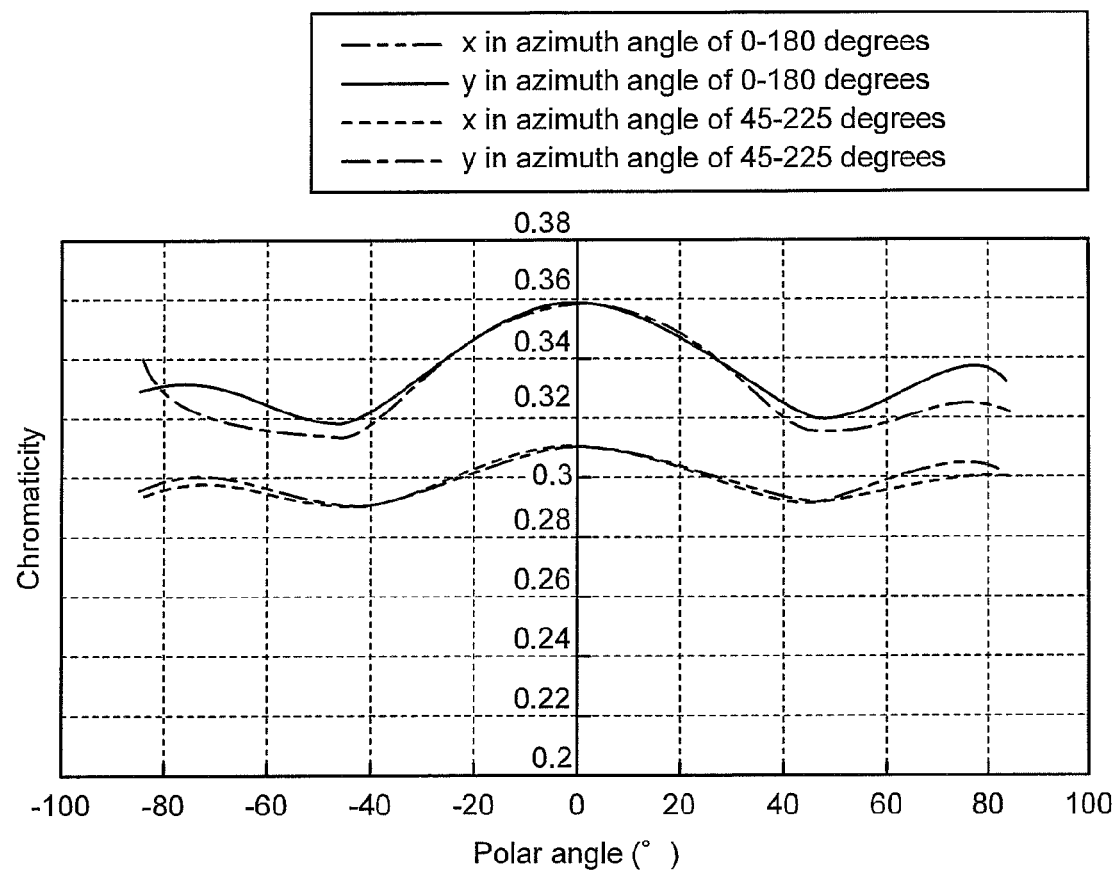
FIG. 15 is a graph showing the results of chromaticity measurement in Comparative Example 1.

As shown in FIG. 15, the maximum values of the change in chromaticity were (Δx, Δy)=(0.020, 0.041) when the azimuth angle ρ was from 0° to 180° and were (Δx, Δy)=(0.020, 0.045) when the azimuth angle ρ was from 45° to 225°.

Therefore, it was found out that, in Comparative Example 1, the light extraction efficiency was improved as compared to that in Reference Example 1 and the change in color at different polar angles was ameliorated. However, as shown in FIG. 15, in the vicinities of polar angles of −70° and +70°, the chromaticity when the azimuth angle ρ was from 0° to 180° was largely different from the chromaticity when the azimuth angle ρ was from 45° to 225°; the difference in the x coordinate of the chromaticity was about 0.1, and the y coordinates of the chromaticity were also different. This showed that the degrees of amelioration of the color change were different from each other at different azimuth angles. Therefore, in Comparative Example 1, the change in appearance (particularly, the change in color tone) at different azimuth angles was large.

Example 1

A multi-layered body which was a rectangular film having a layered structure of (substrate film)/(concavo-convex structure layer) was obtained in the same manner as in Comparative Example 1 except that the shape of the metal mold was changed.

Figure 16:
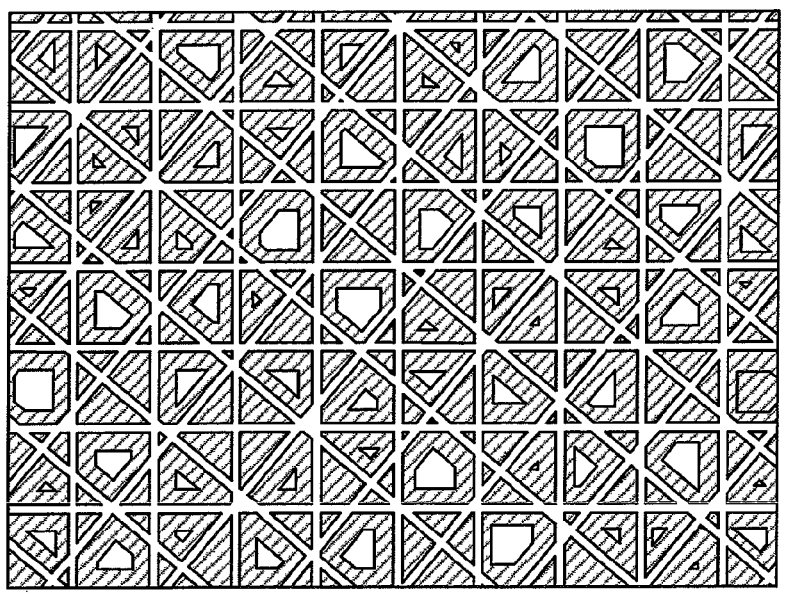
FIG. 16 is a view schematically illustrating the appearance of a part of a concavo-convex structure layer produced in Example 1, as viewed in the thickness direction.

FIG. 16 shows the appearance of a part of the concavo-convex structure layer produced in Example 1, as viewed in the thickness direction. In FIG. 16, white portions represent flat portions, and shaded portions represent inclined surfaces. As shown in FIG. 16, in the multi-layered body in Example 1, when the azimuth angle of 0° is a given azimuth angle in a plane parallel to the surface, the concavo-convex structure on the surface of the concavo-convex structure layer had four groups of streak arrays extending in directions at azimuth angles of 0°, 40°, 90°, and 130°. The concavo-convex structure was composed of a plurality of concave portions having a truncated polygonal pyramid shape or a polygonal pyramid shape and flat portions located around the concave portions. Each streak included a plurality of convex portions disposed along a certain direction. A cross sectional shape of the streak array obtained by cutting the streak array along a plane perpendicular to the extending direction of the streak array was trapezoidal, and all the inclination angles of the inclined surfaces included in the streak array was 60°. The most protruding parts of the respective streak arrays were flat portions, and the width of the flat portions was 5 μm. The pitches of the streak arrays in directions at azimuth angles of 0° and 90° were 35 μm, and the pitches of the streak arrays in directions at azimuth angles of 40° and 130° were 40 μm. In addition, the height of each convex portion was 9 μm.

Figure 17:
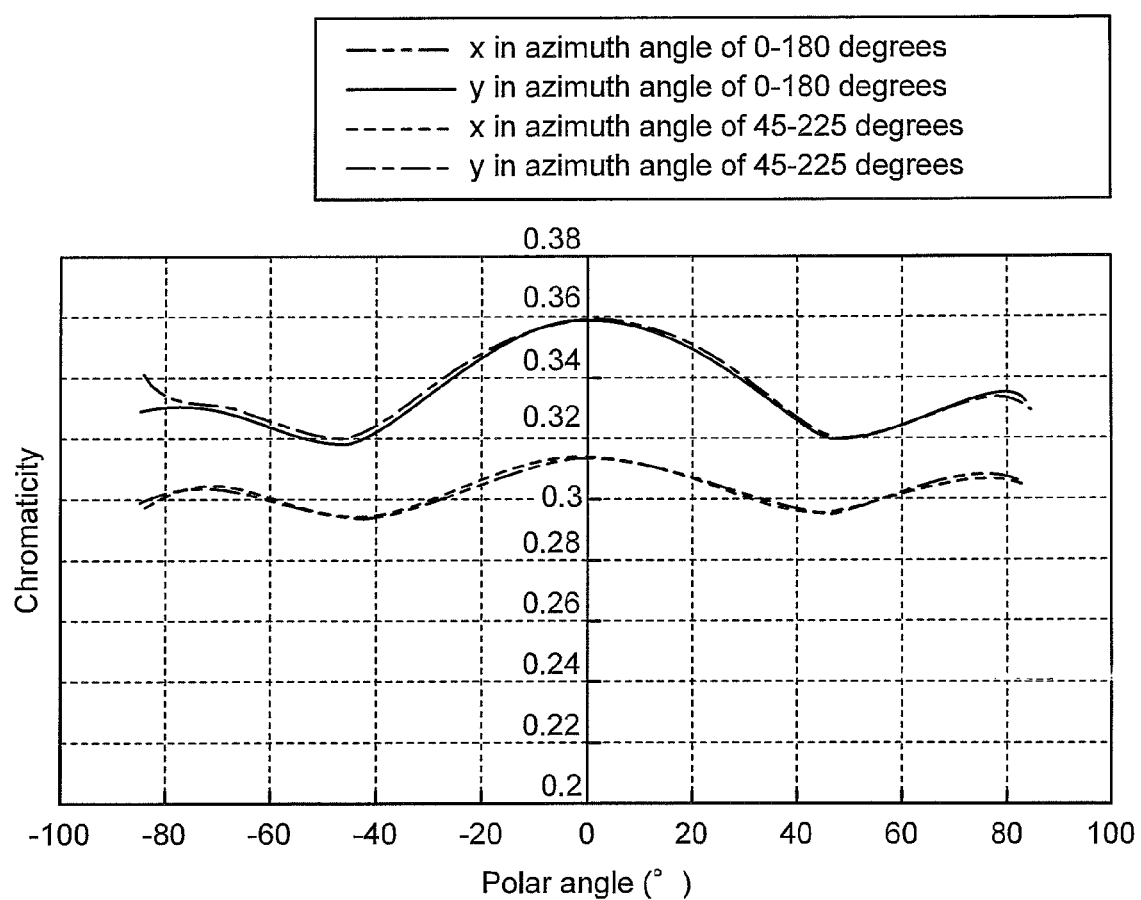
FIG. 17 is a graph showing the results of chromaticity measurement in Example 1.

The aforementioned metal mold was produced by cutting a raw material of the metal mold in four azimuth angle directions using a cutting tool having two 60° inclined angles. The four azimuth angle directions were 0°, 40°, 90°, and 130° directions. The cutting width was 15 μm, and the cutting pitch was 35 μm in directions at azimuth angles of 0° and 90° and was 40 μm in directions at azimuth angles of 40° and 130°.
(Evaluation of Rainbow Unevenness)
The obtained multi-layered body was observed in the same manner as in Comparative Example 1, and the rainbow moire was found to be significantly ameliorated as compared with that in Comparative Example 1.
(Production of Light-Emitting Device)
A light-emitting device including an organic EL element, a bonding layer, and the multi-layered body in this order and having a concavo-convex structure on the surface opposite to the organic EL element (light-emitting surface) was obtained in the same manner as in Reference Example 1 except that the multi-layered body obtained in Example 1 was used as the multi-layered body.
(Measurement of Optical Properties)
The chromaticity (x, y) and brightness were measured with the obtained light-emitting device in the same manner as in Reference Example 1. The results of the measurement of chromaticity (x, y) are shown in FIG. 17.
As a result of the measurement, in Example 1, the light extraction efficiency was improved by 10% and the front brightness was improved by 10% as compared to that in Reference Example 1. The front chromaticity was (0.314, 0.357).
As shown in FIG. 17, the maximum values of the change in chromaticity were $(\Delta x, \Delta y)=(0.019, 0.040)$ when the azimuth angle ρ was from 0° to 180° and were $(\Delta x, \Delta y)=(0.018, 0.038)$ when the azimuth angle ρ was from 45° to 225°.
Therefore, it was found out that, in Example 1, the light extraction efficiency was improved as compared to that in Reference Example 1 and the change in color at different polar angles was ameliorated. In addition, as shown in FIG. 17, the chromaticity when the azimuth angle ρ was from 0° to 180° substantially matched the chromaticity when the azimuth angle ρ was from 45° to 225° at any polar angle. From these results, it was found out that, in Example 1, the degrees of amelioration of the color change were at the same level at different azimuth angles, and the change in appearance (particularly, the change in color tone) at different azimuth angles was small.

Comparative Example 2

Production of Multi-Layered Body

A multi-layered body which was a rectangular film having a layered structure of (substrate film)/(concavo-convex structure layer) was obtained in the same manner as in Comparative Example 1 except that the inclination angles of all the inclined surfaces of the concavo-convex structure on the surface of the concavo-convex structure layer were changed to 45°.
(Evaluation of Rainbow Unevenness)
The obtained multi-layered body was observed in the same manner as in Comparative Example 1, and a rainbow moire was observed.
(Production of Light-Emitting Device)
A light-emitting device including an organic EL element, a bonding layer, and the multi-layered body in this order and having a concavo-convex structure on the surface opposite to the organic EL element (light-emitting surface) was obtained in the same manner as in Reference Example 1 except that the multi-layered body obtained in Comparative Example 2 was used as the multi-layered body.
(Measurement of Optical Properties)
The brightness was measured with the obtained light-emitting device in the same manner as in Reference Example 1. As a result of the measurement, in Comparative Example 2, the light extraction efficiency was improved by 10% as compared to that in Reference Example 1 and the front brightness was 1.4 times that in Reference Example 1.

Example 2

A multi-layered body which was a rectangular film having a layered structure of (substrate film)/(concavo-convex structure layer) was obtained in the same manner as in Example 1 except that the inclination angles of all the inclined surfaces in the concavo-convex structure on the surface of the concavo-convex structure layer were changed to 45°.
(Evaluation of Rainbow Unevenness)
The obtained multi-layered body was observed in the same manner as in Comparative Example 1, and the rainbow moire was found to be significantly ameliorated as compared with that in Comparative Example 2.
(Production of Light-Emitting Device)
A light-emitting device including an organic EL element, a bonding layer, and the multi-layered body in this order and having a concavo-convex structure on the surface opposite to the organic EL element (light-emitting surface) was obtained in the same manner as in Reference Example 1 except that the multi-layered body obtained in Example 2 was used as the multi-layered body.
(Measurement of Optical Properties)
The brightness was measured with the obtained light-emitting device in the same manner as in Reference Example 1. As a result of the measurement, in Example 2, the light extraction efficiency was improved by 10% as compared to that in Reference Example 1 and the front brightness was 1.35 times that in Reference Example 1. This showed that when the inclination angles of the inclined surfaces of the streak arrays were 45°, the effects of improving the front brightness were obtained as well as in Comparative Example 1 in which the inclination angles were 60°.

INDUSTRIAL APPLICABILITY

The light-emitting device of the present invention can be used for any applications as light sources and is particularly suitable for lighting devices and backlights of display devices.

DESCRIPTION OF NUMERALS

10: Light-emitting device
20: Light-emitting device
30: Light-emitting device
40: Light-emitting device
10U: Light-emitting surface
100: Light-emitting surface structure layer
110: Multi-layered body
111: Concavo-convex structure layer
112: Substrate film layer
113: First streak array
113U: Flat portion
113S: Inclined surface
114: Second streak array
114U: Flat portion 114S: Inclined surface
115: Third streak array
115U: Flat portion
115S: Inclined surface
116: Fourth streak array
116U: Flat portion
116S: Inclined surface
117: Concave portion
117B: Flat portion
121: Bonding layer
131: Supporting substrate
140: Organic EL element
141: First electrode layer
142: Light-emitting layer
143: Second electrode layer
144: Light-emitting surface
145: Surface of the organic EL element
151: Sealing substrate
340: Organic EL element
343: Second electrode layer
345: Light-emitting layer

The invention claimed is:

1. A light-emitting device comprising: an organic electroluminescent element that has a light-emitting surface and emits light from the light-emitting surface; and a structure layer disposed directly or indirectly on the light-emitting surface of the organic electroluminescent element; wherein the structure layer comprises, on a surface thereof that is opposite to the organic electroluminescent element, a concavo-convex structure comprising a first streak array extending continuously in a first direction that is parallel to the surface, a second streak array extending continuously in a second direction that is parallel to the surface and intersects with the first direction, and a third streak array extending continuously in a third direction that is parallel to the surface and intersects with the first direction and the second direction, wherein the concavo-convex structure has three or more heights that are different from each other by 0.1 μm or larger.

2. The light-emitting device according to claim 1, wherein the concavo-convex structure further includes a fourth streak array extending in a fourth direction that is parallel to the surface of the structure layer that is opposite to the organic electroluminescent element, and that intersects with the first direction, the second direction, and the third direction.

3. The light-emitting device according to claim 1, wherein a shape of a cross section of each of the streak arrays that is obtained by cutting the streak array along a plane perpendicular to the extending direction thereof is a polygonal shape having three or more sides.

4. The light-emitting device according to claim 1, wherein the concavo-convex structure has a flat portion parallel to the light-emitting surface.

5. The light-emitting device according to claim 1, wherein the concavo-convex structure has inclined surfaces inclined with respect to the light-emitting surface, and
an average inclination angles of the inclined surfaces with respect to the light-emitting surface is 55° or larger and 85° or smaller.

6. The light-emitting device according to claim 1, wherein the first streak array is a group of plural rows of only concave portions formed in a groove shape extending continuously in the first direction that is parallel to the surface, the second streak array is a group of plural rows of only concave portions formed in a groove shape extending continuously in the second direction that is parallel to the surface and intersects with the first direction, and the third streak array is a group of plural rows of only concave portions formed in a groove shape extending continuously in the third direction that is parallel to the surface and intersects with the first direction and the second direction.

7. The light-emitting device according to claim 1, wherein the first streak array is a group of plural rows of only convex portions formed in a ridge shape extending continuously in the first direction that is parallel to the surface, the second streak array is a group of plural rows of only convex portion formed in a ridge shape extending continuously in the second direction that is parallel to the surface and intersects with the first direction, and the third streak array is a group of plural rows of only convex portions formed in a ridge shape extending continuously in the third direction that is parallel to the surface and intersects with the first direction and the second direction.

* * * * *